US012813319B2

(12) United States Patent
Hsu et al.

(10) Patent No.: US 12,813,319 B2
(45) Date of Patent: Nov. 24, 2026

(54) ELECTRONIC DEVICE HAVING ELECTRONIC COMPONENT AND CONDUCTIVE ELEMENT WITHIN REINFORCEMENT

(71) Applicant: Advanced Semiconductor Engineering, Inc., Kaohsiung (TW)

(72) Inventors: Chih-Jing Hsu, Kaohsiung (TW); Hsu-Nan Fang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 396 days.

(21) Appl. No.: 18/491,720

(22) Filed: Oct. 20, 2023

(65) Prior Publication Data

US 2025/0132278 A1 Apr. 24, 2025

(51) Int. Cl.

| | |
|---|---|
| ***H10W 74/01*** | (2026.01) |
| ***H10W 70/05*** | (2026.01) |
| ***H10W 70/60*** | (2026.01) |
| ***H10W 70/65*** | (2026.01) |
| ***H10W 70/652*** | (2026.01) |
| ***H10W 72/00*** | (2026.01) |

(Continued)

(52) U.S. Cl.

CPC ......... *H10W 74/014* (2026.01); *H10W 90/00* (2026.01); *H10W 70/05* (2026.01); *H10W 70/093* (2026.01); *H10W 70/60* (2026.01); *H10W 70/65* (2026.01); *H10W 70/652* (2026.01); *H10W 70/6523* (2026.01); *H10W 72/01935* (2026.01); *H10W 72/0198* (2026.01); *H10W 72/07554* (2026.01); *H10W 72/354* (2026.01); *H10W 72/552* (2026.01); *H10W 72/5522* (2026.01); *H10W 72/5524* (2026.01); *H10W 72/5525* (2026.01); *H10W 72/59* (2026.01); *H10W 72/853* (2026.01); *H10W 72/874* (2026.01); *H10W 72/879* (2026.01); *H10W 72/884* (2026.01); *H10W 72/90* (2026.01); *H10W 72/922* (2026.01); *H10W 72/9223* (2026.01); *H10W 72/923* (2026.01); *H10W 72/9415* (2026.01); *H10W 72/952* (2026.01); *H10W 90/22* (2026.01); *H10W 90/722* (2026.01); *H10W 90/724* (2026.01); *H10W 90/732* (2026.01); *H10W 90/754* (2026.01)

(58) Field of Classification Search

None

See application file for complete search history.

(56) References Cited

U.S. PATENT DOCUMENTS

2019/0304910 A1* 10/2019 Fillion ........... H03K 19/017545
2023/0274998 A1* 8/2023 Pan ....................... H10W 40/22
257/668

(Continued)

FOREIGN PATENT DOCUMENTS

CN 116613150 A 8/2023

*Primary Examiner* — Chad M Dicke
*Assistant Examiner* — Jeremy Daniel Watts
(74) *Attorney, Agent, or Firm* — Foley & Lardner LLP

(57) ABSTRACT

An electronic device is disclosed. The electronic device includes a unit chip. The unit chip includes an electronic component having a power delivery circuit and a reinforcement supporting the electronic component. The reinforcement is configured to transmit a power signal to the power delivery circuit. The reinforcement includes a thermosetting reinforcement or a glass reinforcement.

20 Claims, 40 Drawing Sheets

FIG. 1A

(51) Int. Cl.

| | |
|---|---|
| ***H10W 72/30*** | (2026.01) |
| ***H10W 72/50*** | (2026.01) |
| ***H10W 72/59*** | (2026.01) |
| ***H10W 72/90*** | (2026.01) |
| ***H10W 90/00*** | (2026.01) |
| ***H10W 90/22*** | (2026.01) |

(56) References Cited

U.S. PATENT DOCUMENTS

2023/0326861 A1 10/2023 Lin et al.
2025/0087646 A1* 3/2025 Chung .................... H10P 72/74

* cited by examiner

ELECTRONIC DEVICE HAVING ELECTRONIC COMPONENT AND CONDUCTIVE ELEMENT WITHIN REINFORCEMENT

BACKGROUND

1. Field of the Disclosure

The present disclosure generally relates to an electronic device.

2. Description of the Related Art

A power path can deliver power through the backside of devices, eliminating the need to share interconnect resources between signal and power lines on the front side. However, backside power design requires thinning of the silicon substrate, which increases process constraints.

SUMMARY

In some arrangements, an electronic device includes a unit chip. The unit chip includes an electronic component having a power delivery circuit and a reinforcement supporting the electronic component. The reinforcement is configured to transmit a power signal to the power delivery circuit. The reinforcement includes a thermosetting reinforcement or a glass reinforcement.

In some arrangements, an electronic device includes a unit chip. The unit chip includes an electronic component having a power delivery circuit and a logic circuit. The unit chip includes a reinforcement supporting the electronic component and having a power regulating device configured to provide a power signal to the logic circuit through the power delivery circuit.

In some arrangements, an electronic device includes a unit chip. The unit chip includes an electronic component having I/O connections, a power delivery circuit, and a logic circuit between the I/O bumps and the power delivery circuit. The unit chip also includes a reinforcement supporting the electronic component and exclusive of a capacitance device. The unit chip also includes a conductive element penetrating the reinforcement.

BRIEF DESCRIPTION OF THE DRAWINGS

Aspects of some arrangements of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
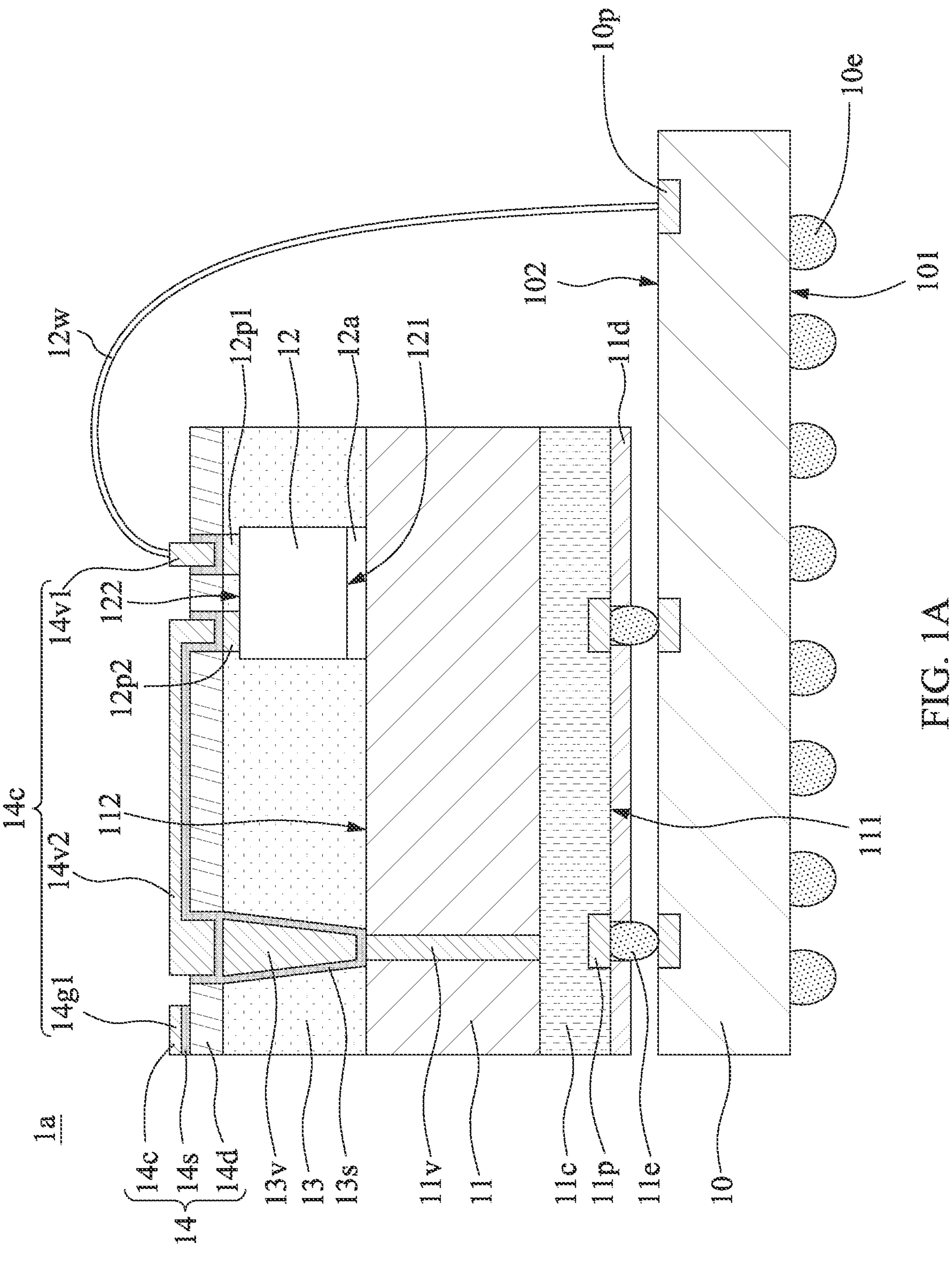
FIG. 1A illustrates a cross-sectional view of an example of an electronic device according to some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

FIG. 1A illustrates a cross-sectional view of an example of an electronic device 1*a* according to some arrangements of the present disclosure. In some arrangements, the electronic device 1*a* may include a package, such as a semiconductor device package. In some arrangements, the electronic device 1*a* may include a carrier 10, an electronic component 11, a power regulating device 12, a supporting element 13, and an interconnection structure 14.

In some arrangements, the carrier 10 may include, for example, a printed circuit board (PCB), such as a paper-based copper foil laminate, a composite copper foil laminate, or a polymer-impregnated glass-fiber-based copper foil laminate. In some arrangements, the carrier 10 may include a surface 101 and a surface 102 opposite to the surface 101. The carrier 10 may include one or more conductive pads 10*p* in proximity to, adjacent to, or embedded in and exposed from the surface 101 and/or 102 of the carrier 10. The carrier 10 may include a solder resist (not shown) on the surface 101 and/or 102 of the carrier 10 to fully expose or to expose at least a portion of the conductive pads 10*p* for electrical connections, including, for example, the power routing path (or the power path) and the signal routing path (or the signal path) in the electronic device 1*a*.

In some arrangements, the carrier 10 may provide power and/or grounding connections to the devices or components electrically connected with the carrier 10. For example, the carrier 10 may have a connector or terminal configured to be electrically connected with a power source or a power supply (not illustrated in the figures). The carrier 10 and a conductive element 12*w* may provide a power path (such as through a redistribution layer (RDL) in the carrier 10 and along the conductive element 12*w*) between the power supply and the power regulating device 12, which in turn may provide a regulated power signal to the electronic component 11.

As used herein, a signal path may refer to a path through which an electrical signal may be transmitted. Such an electrical signal may include either analog or digital signals. Additionally, a power path, as used and described herein, may refer to a path dedicated to power supply connections.

In some arrangements, an electrical contact 10*e* may be disposed on the surface 101 of the carrier 10, and can provide electrical connections between the electronic device 1 and external components (e.g., external circuits or circuit boards). In some arrangements, the electrical contact 10*e* may include a connector. In some arrangements, the electrical contact 10*e* may include a solder ball, such as a controlled collapse chip connection (C4) bump, a ball grid array (BGA) or a land grid array (LGA).

The electronic component 11 may be disposed on the surface 101 of the carrier 10. In some arrangements, the electronic component 11 may include an active device. In some arrangements, the electronic component 11 may include circuits or circuit elements that rely on an external power supply to control or modify electrical signals. For example, the electronic component 11 may include a processor, a controller, a memory, or an input/output (I/O)) buffer, etc. For example, the electronic component 11 may include a system on chip (SoC). For example, the electronic component 11 may include a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. For example, the electronic component 11 may include a memory, such as a high bandwidth memory (HBM).

In some arrangements, the electronic component 11 may include a surface 111 facing the carrier 10 and a surface 112 opposite to the surface 111. In some arrangements, the surface 111 may include an active surface (or a front side) and the surface 112 may include a backside surface. The electronic component 11 may include one or more conductive pads 11*p* in proximity to, adjacent to, or embedded in and exposed from the surface 111. The electronic component 11 may include a solder resist 11*d* on the surface 111 to fully expose or to expose at least a portion of the conductive pads 11*p* for electrical connections. In some arrangements, the electronic component 11 may be electrically connected with the carrier 10 through an electrical contact 11*e*, such as solder balls.

In some arrangements, an electrical signal may be transmitted through the active surface (e.g., the surface 111) of the electronic component 11. For example, a signal path may pass through the active surface (e.g., the surface 111) of the electronic component 11.

For example, the electronic component 11 may include a circuit region 11*c* in proximity to, adjacent to, or disposed over the surface 111. The circuit region 11*c* may be configured to transmit an electrical signal to the carrier 10 and/or to receive an electrical signal from the carrier 10 through the electrical contact 11*e*. For example, the electrical contact 11*e* may include input/output (I/O) connections (such as I/O bumps) between the circuit region 11*c* and the carrier 10. In some arrangements, the circuit region 11*c* may include a logic circuit. For example, the circuit region 11*c* may be configured to perform a logical operation on input electrical signals.

In some arrangements, a power signal (or a regulated power signal) may be transmitted through the backside surface (e.g., the surface 112) of the electronic component 11. For example, a power path may pass through the backside surface (e.g., the surface 112) of the electronic component 11.

For example, the electronic component 11 may include a power delivery circuit (or a power delivery network) configured to receive a power signal (or a regulated power signal) from the power regulating device 12 and transmit the power signal (or the regulated power signal) to the circuit region 11*c*. The power delivery circuit may include interconnects in the power path from a conductive element 13*v* to the circuit region 11*c*. For example, the power delivery circuit may include a conductive element 11*v*.

A signal path may pass through the active surface (e.g., the surface 111) and a power path may pass through the backside surface (e.g., the surface 112) of the electronic component 11. In other words, the signal path and the power path may be provided over opposite sides of the electronic component 11. For example, the signal path and the power path may be provided over opposite sides of the circuit region 11*c* For example, the I/O bumps (such as the electrical contact 11*e*) and the power delivery circuit (such as the conductive element 11*v*) may be provided over opposite sides of the circuit region 11*c*.

In some arrangements, the conductive element 11*v* may include a conductive via (such as a through-silicon via (TSV)) and/or a conductive pillar. The conductive element 11*v* may be disposed in the electronic component 11. In some arrangements, the conductive element 11*v* may at least partially extend between the surface 111 and the surface 112. The conductive element 11*v* may be at least partially exposed from the surface 112. In some arrangements, the conductive element 11*v* may be electrically connected with the conductive element 13*v* and the circuit region 11*c*.

The location and number of the conductive element 11*v* in the electronic component 11 are not intended to limit the present disclosure. For example, there may be any number of the conductive element(s) on any location in the electronic component 11 due to design requirements.

The location and number of the electronic component 11 in the electronic device 1*a* are not intended to limit the present disclosure. For example, there may be any number of the electronic component(s) on any location in the electronic device 1*a* due to design requirements.

The power regulating device 12 may be disposed over the surface 112 of the electronic component 11. The electronic component 11 may be disposed between the power regulating device 12 and the carrier 10. In some arrangements, the power regulating device 12 may include a power management integrated circuit (PMIC). In some arrangements, the power regulating device 12 may be configured to provide a regulated power signal to the electronic component 11. In some arrangements, the power regulating device 12 may include a voltage regulator, such as a linear regulator (which is configured to maintain a constant output voltage) or a switching regulator (which is configured to generate an output voltage higher than or lower than the input voltage). In some arrangements, the power regulating device 12 may include a step-down (buck) converter, a step-up (boost) converter, an analog-to-digital converter, a digital-to-analog converter, an AC-DC converter, a DC-DC converter, other types of converters, or a combination thereof.

The power regulating device 12 may include a surface 121 facing the electronic component 11 and a surface 122 opposite to the surface 121. In some arrangements, the surface 122 may include an active surface and the surface 121 may include a backside surface. The power regulating device 12 may be connected or attached to the electronic component 11 through an adhesive layer 12*a*, such as a glue or epoxy.

The power regulating device 12 may include conductive pads 12*p*1 and 12*p*2 in proximity to, adjacent to, or embedded in and exposed from the surface 122. The conductive pads 12*p*1 and 12*p*2 may include conductive pillars. The power regulating device 12 may include a solder resist (not shown) on the surface 122 to fully expose or to expose at least a portion of the conductive pads 12*p*1 and 12*p*2 for the power paths in the electronic device 1*a*. The power regulating device 12 may be electrically connected with the interconnection structure 14 through the conductive pads 12*p*1 and 12*p*2.

The power regulating device 12 may be configured to receive a power signal from a power source through the carrier 10, the conductive element 12*w*, and the interconnection structure 14. The conductive element 12*w* (e.g., a conductive wire, a conductive trace, or another connection element or connection) may be connected between the interconnection structure 14 and the conductive pad 10*p* of the carrier 10.

In some arrangements, the conductive element 12*w* may include conductive materials, such as copper (Cu), tin (Sn), aluminum (Al), gold (Au), silver (Ag), tungsten (W), nickel (Ni), palladium (Pd), other suitable materials, or a combination of two or more thereof. In some arrangements, the conductive element 12*w* may extend along a lateral surface or a sidewall (e.g, a surface extending between the surface 111 and the surface 112) of the electronic component 11. In some arrangements, the conductive element 12*w* may extend along a lateral surface or a sidewall (e.g., a surface extending between the surface 121 and the surface 122) of the power regulating device 12. In some arrangements, the conductive element 12*w* may be outside of the supporting element 13, the electronic component 11, or the unit chip (which may include the supporting element 13 and the electronic component 11). In some arrangements, the conductive element 12*w* may not be covered by the supporting element 13, the electronic component 11, or the unit chip (which may include the supporting element 13 and the electronic component 11).

The power regulating device 12 may regulate the power signal and provide a regulated power signal to the electronic component 11 through the interconnection structure 14 and the conductive element 13*v*.

In some arrangements, the power regulating device 12 may receive a power signal through the conductive pad 12*p*1 and transmit a regulated power signal through the conductive pad 12*p*2. In some arrangements, the power transmitting direction of the power path through the conductive pad 12*p*1 and the power transmitting direction of the power path through the conductive pad 12*p*2 may be opposite to each other.

In some arrangements, the power regulating device 12 may not be disposed over the carrier 10. The I/O pins on the carrier 10 for connecting the power regulating device 12 may be not needed. Therefore, a dimension (e.g., a width) of the carrier 10 can be decreased and the manufacturing costs can be reduced.

The location and number of the power regulating device 12 in the electronic device 1*a* are not intended to limit the present disclosure. For example, there may be any number of the power regulating device(s) on any location in the electronic device 1*a* due to design requirements.

The supporting element 13 may be disposed over the surface 112 of the electronic component 11. The supporting element 13 may cover, encapsulate, or surround the power regulating device 12. In some arrangements, the power regulating device 12 may be embedded in the supporting element 13. In some arrangements, the power regulating device 12 may be at least partially embedded or disposed in the supporting element 13.

In some arrangements, the supporting element 13 may include a reinforcement or a strengthening structure or material. In some arrangements, the supporting element 13 may include an encapsulant and/or a molding compound. In some arrangements, the supporting element 13 may include a thermosetting polymer, such as an epoxy, a silicone, a polyurethane, a polyimide (PI), a phenolic, or a combination thereof. For example, the supporting element 13 may include a thermosetting reinforcement. In some arrangements, the supporting element 13 may include reinforcing fillers or fibers, such as fiberglass, carbon fiber, and/or Kevlar. In some arrangements, the supporting element 13 may include inorganic materials, such as silicon, a glass, or a ceramic. For example, the supporting element 13 may include a glass reinforcement (such as the arrangement shown in FIG. 4).

In some arrangements, the supporting element 13 may provide structural support for the electronic component 11. For example, the supporting element 13 may include a warpage control structure to reduce the high stress experienced by bonded various materials in the electronic device 1*a* during cycles of heating and cooling. In some arrangements, the supporting element 13 and the electronic component 11 may constitute a unit chip, an integrated chip, or a monolithic chip. In some arrangements, the supporting element 13 and the electronic component 11 may constitute an application-specific integrated chip (ASIC).

Figure 5A:
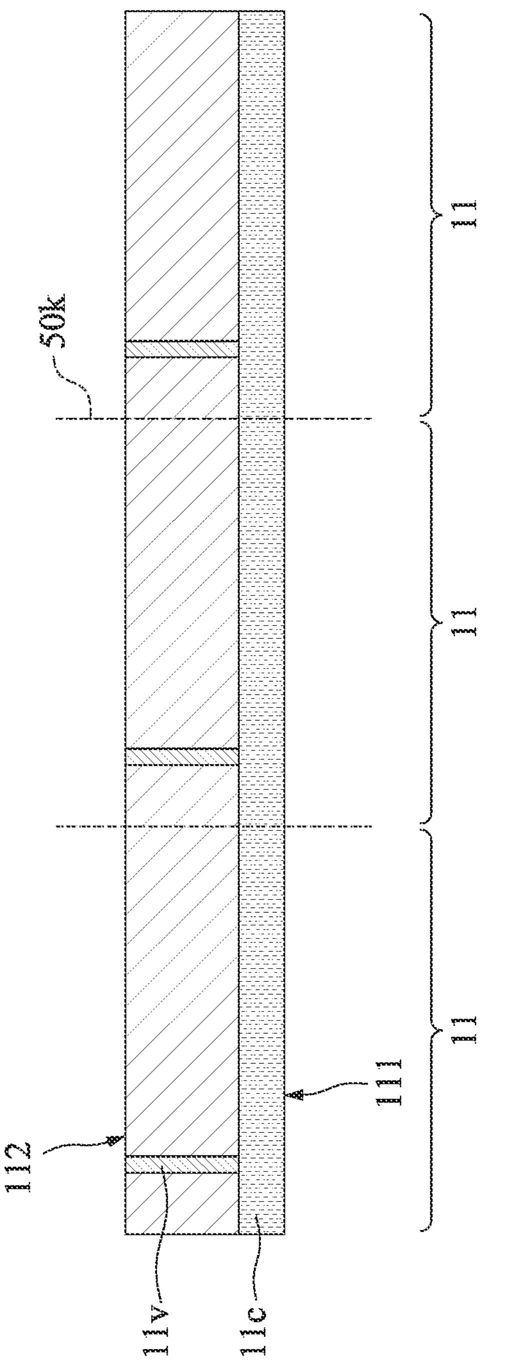
FIG. 5A, 5B, 5C, 5D, 5E, 5F, 5G, 5H, 5I, 5J, 5K, 5K-1, 5L, 5M, 5N, 5O, 5P, 5Q, 5R, and 5S illustrate cross-sectional views in one or more stages of a method of manufacturing an electronic device in accordance with an arrangement of the present disclosure.
Figure 5B:
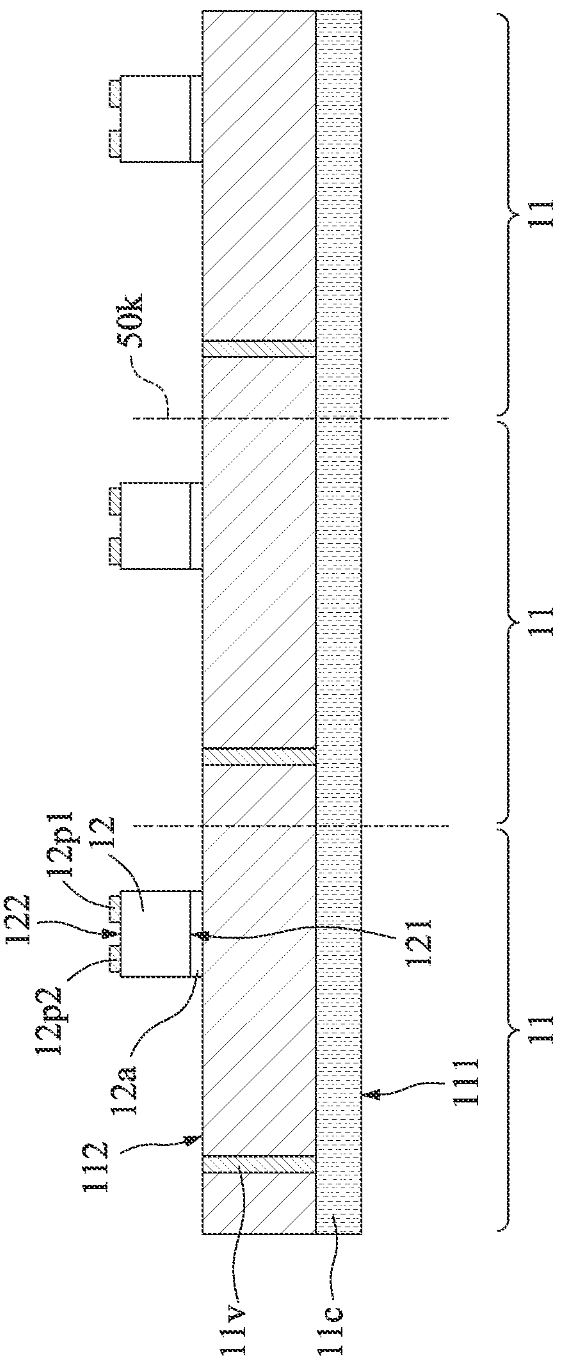
Figure 5C:
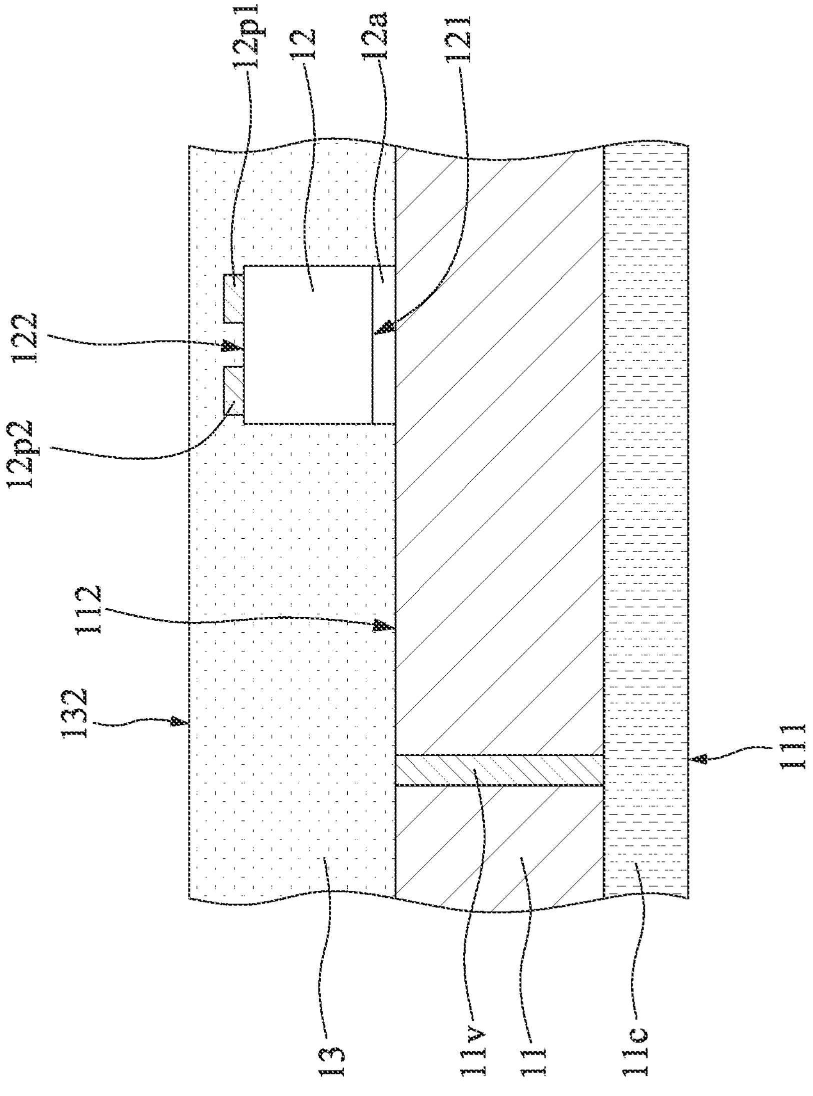

In some arrangements, the unit chip (which may include the supporting element 13 and the electronic component 11) may be disposed over the carrier 10. The carrier 10 and the conductive element 12*w* provide a power path from a power source to the unit chip. In some arrangements, the unit chip may be obtained from a singulation operation (as shown in FIGS. 5R and 5S) and disposed over the carrier 10. In some arrangements, a lateral surface of the supporting element 13 and a lateral surface of the electronic component 11 in the unit chip may be substantially coplanar.

In some arrangements, the conductive element 13*v* may include a conductive via (such as a through-molding via (TMV)) and/or a conductive pillar. The conductive element 13*v* may be disposed in or within the supporting element 13. For example, the conductive element 13*v* may be surrounded by the reinforcing fillers or fibers of the supporting element 13. For example, from a cross-sectional view, the reinforcing fillers or fibers of the supporting element 13 may be disposed on at least two sides of the conductive element 13*v*.

In some arrangements, the conductive element 13*v* may at least partially extend between the surface 112 and the interconnection structure 14. In some arrangements, the conductive element 13*v* may extend throughout the supporting element 13. For example, the conductive element 13*v* may run through or penetrate the supporting element 13. The conductive element 13*v* may be at least partially exposed from the supporting element 13. In some arrangements, the conductive element 13*v* may be electrically connected with the conductive element 11*v* and the interconnection structure 14. In some arrangements, the conductive element 13*v* may taper toward the power delivery circuit (such as the conductive element 11*v*) of the electronic component 11.

In some arrangements, the conductive element 13*v* of the supporting element 13 may be configured to transmit a power signal to the backside surface (e.g., the surface 112) of the electronic component 11. In some arrangements, the conductive element 13*v* of the supporting element 13 may be configured to transmit a power signal to the power delivery circuit (such as the conductive element 11*v*) of the electronic component 11. In some arrangements, the conductive element 13*v* of the supporting element 13 may be configured to provide, constitute, define, and establish at least a part of a power path of the electronic component 11.

A seed layer 13*s* may be disposed along a sidewall, a bottom surface, and a top surface of the conductive element 13*v*. The seed layer 13*s* may be disposed between the conductive element 13*v* and the supporting element 13. The seed layer 13*s* may include, for example, titanium (Ti), copper (Cu), Nickel (Ni), another metal, or an alloy (such as a titanium-tungsten alloy (TiW)). The conductive element 13*v* may include conductive materials, such as copper (Cu), tin (Sn), aluminum (Al), gold (Au), silver (Ag), tungsten (W), nickel (Ni), palladium (Pd), other suitable materials, or a combination of two or more thereof.

The conductive element 13*v* may be substantially aligned with the conductive element 11*v*. The conductive element 13*v* may be at least partially overlapped with the conductive element 11*v* in a direction substantially perpendicular to the surface 111 and/or the surface 112. The conductive element 13*v* and the conductive element 11*v* may include the same material. In some other arrangements, the conductive element 13*v* and the conductive element 11*v* may include different materials.

The location and number of the conductive element 13*v* in the supporting element 13 are not intended to limit the present disclosure. For example, there may be any number of the conductive element(s) on any location in the supporting element 13 due to design requirements.

The interconnection structure 14 may be disposed over the supporting element 13. The interconnection structure 14 may be electrically connected with the conductive element 13*v* and the power regulating device 12. The interconnection structure 14 may be configured to provide a power path between the conductive element 12*w* and the power regulating device 12. The interconnection structure 14 may be configured to provide a power path between the power regulating device 12 and the conductive element 13*v*.

The interconnection structure 14 may include a conductive layer 14*c*, a seed layer 14*s*, and a dielectric layer 14*d*. The dielectric layer 14*d* may be disposed over the supporting element 13 and the power regulating device 12. The dielectric layer 14*d* may include openings according to locations defined to form electrical connections. For example, the conductive element 13*v*, the conductive pad 12*p*1, and the conductive pad 12*p*2 may correspond to the locations of the openings. The conductive layer 14*c* may at least partially fill the openings. For example, the conductive element 13*v*, the conductive pad 12*p*1, and the conductive pad 12*p*2 be exposed from the supporting element 13 and contact the conductive layer 14*c*. The seed layer 14*s* may be disposed along a sidewall and a bottom surface of the conductive layer 14*c*.

In some arrangements, the seed layer 14*s* may include, for example, titanium (Ti), copper (Cu), Nickel (Ni), another metal, or an alloy (such as a titanium-tungsten alloy (TiW)). The conductive layer 14*c* may include conductive materials, such as copper (Cu), tin (Sn), aluminum (Al), gold (Au), silver (Ag), tungsten (W), nickel (Ni), palladium (Pd), other suitable materials, or a combination of two or more thereof. The dielectric layer 14*d* may include, for example, one or more organic materials (e.g., polyamide (PA), a polyimide (PI), a polybenzoxazole (PBO), an epoxy, and an epoxy-based material)), or one or more inorganic materials (e.g, silicon, a glass, a ceramic, and an oxide). In some arrangements, an interface may be formed between the seed layer 14*s* and the seed layer 13*s*, as shown in FIG. 5K-1.

In some arrangements, one or more passive devices may be integrated in the interconnection structure 14 and/or the electronic component 11. In some arrangements, the passive devices may be present in the power paths.

The passive devices may be circuits or circuit elements that do not need an external power source to function and do not provide electrical gain. In some arrangements, the passive devices may be passive devices of different types, such as inductance devices (or inductors), capacitance devices (or capacitors), resistors, diodes, fuses or antifuses, etc.

In some arrangements, the supporting element 13 may be exclusive of a passive device. In some arrangements, the supporting element 13 may be exclusive of a capacitance device (or a capacitor). For example, the supporting element 13 may be exclusive of a deep trench capacitor (DTC), a multi-layer ceramic capacitor (MLCC) or other capacitors. For example, the supporting element 13 may not include a capacitor or a capacitive element that is intentionally provided. For example, the supporting element 13 may include a non-capacitive element configured to provide, constitute, define, and establish at least a part of a power path of the electronic component 11 (such as through the conductive element 13*v*).

In a comparative arrangement, a power path can deliver power through the backside of devices, eliminating the need to share interconnect resources between signal and power lines on the front side. However, backside power design requires thinning of the silicon substrate, which increases process constraints. In another comparative arrangement, static random access memory (SRAM) can be provided over the front. While SRAM can be used to control and manage power circuitry, it does not directly solve the handling problems associated with backside power devices.

According to some arrangements of the present disclosure, the supporting element 13 may provide structural support and warpage control for the electronic component 11. The production rate and the manufacturing yield can be increased.

In addition, the power regulating device 12 may be embedded in the supporting element 13 to shorten the power path between the power regulating device 12 and the electronic component 11. For example, the power path can be shorter than if the power regulating device 12 and the electronic component 11 are disposed side-by-side. Therefore, the voltage drop of the power path can be decreased and the supply power for the power regulating device 12 can be lower. In addition, the electronic device 1*a* can be further miniaturized.

Furthermore, separating the power path and the signal path on opposite sides of the electronic component 11 allows these different metal layers to be optimally fabricated—as wider lines for power/grounding signals, and thinner lines to carry electrical signals. For example, the line/space of the circuit region 11*c* may be about 10 μm/10 μm or less, such as 5 μm/5 μm or 2 μm/2 μm. The circuit region 11*c* with thinner lines may be able to provide more signal paths for supporting high-speed signals.

The interconnection structure 14 may include a grounding layer to increase the copper coverage rate. The grounding layer may help alleviate or prevent the temperature of the electronic component 11 from exceeding an advisable temperature. The grounding layer may help dissipate heat generated by the electronic component 11. Therefore, the reliability of the electronic device 1*a* may be improved. In addition, the grounding layer may improve the electromagnetic compatibility (EMC) performance.

Figure 1B:
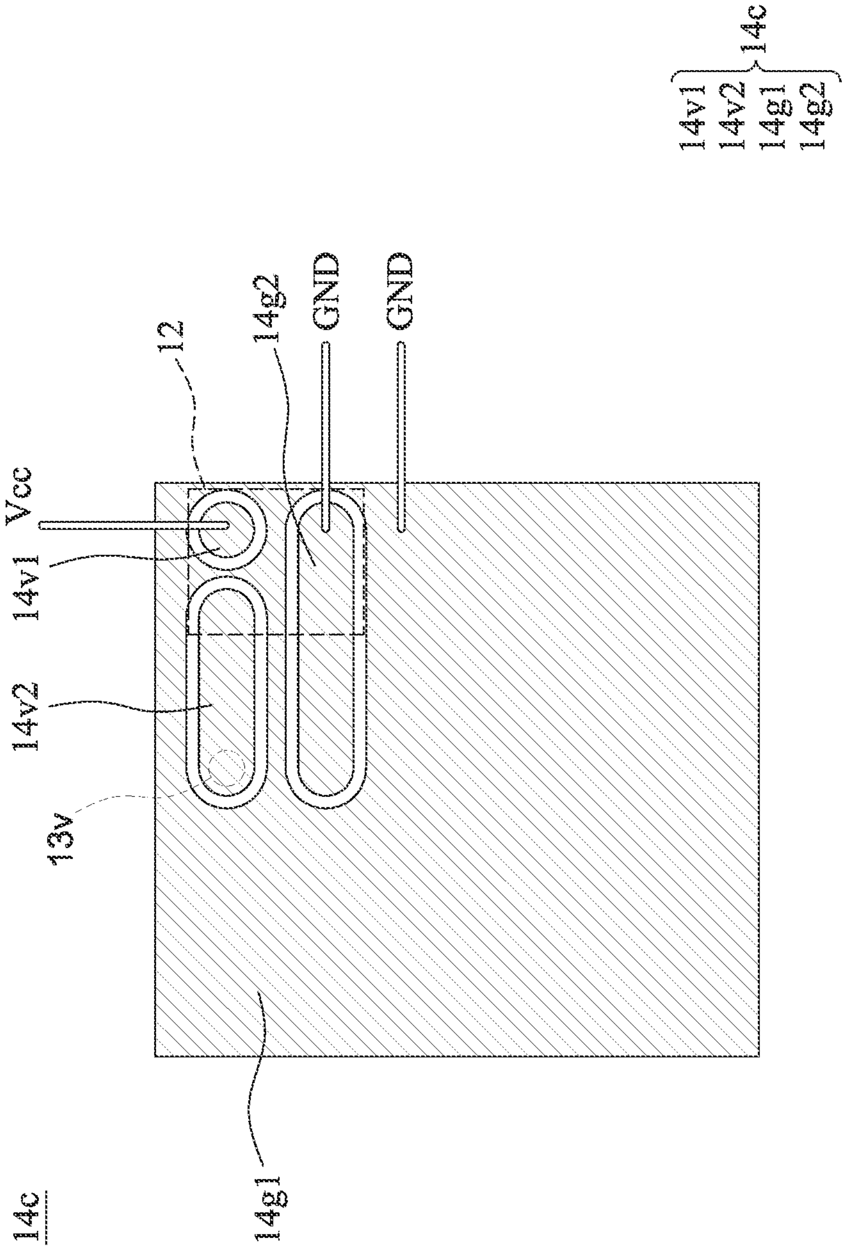
FIG. 1B illustrates a top view of an example of a part of an electronic device according to some arrangements of the present disclosure.

FIG. 1B illustrates a top view of an example of a part of an electronic device according to some arrangements of the present disclosure. In some arrangements, the structure illustrated in FIG. 1B may be a part of the electronic device 1*a* in FIG. 1A.

Referring to FIG. 1A and FIG. 1B, the conductive layer 14*c* of the interconnection structure 14 may include a patterned layer and may have different I/O connections separated from one another. For example, the conductive layer 14*c* may have grounding layers (or grounding lines) 14*g*1 and 14*g*2 configured to connect to a grounding voltage GND. For example, the conductive layer 14*c* may have a power line 12*v*1 configured to connect the conductive pad 12*p*1 of the power regulating device 12 to a power source (or voltage supply) Vcc. For example, the conductive layer 14*c* may have a power line 12*v*2 configured to connect the conductive pad 12*p*2 of the power regulating device 12 to the conductive element 13*v*. The numbers and locations of the power lines and grounding lines may be adjusted depending on design requirements are not limited thereto. Although the wire connections for connecting the grounding voltage GND and the power source Vcc are shown in FIG. 1B, the present disclosure are not limited thereto. The wire connections may be a part of the electronic device 1*a*. The wire connections may not be a part of the electronic device 1*a*. In some arrangements, the connections may be wireless connections.

Figure 1E:
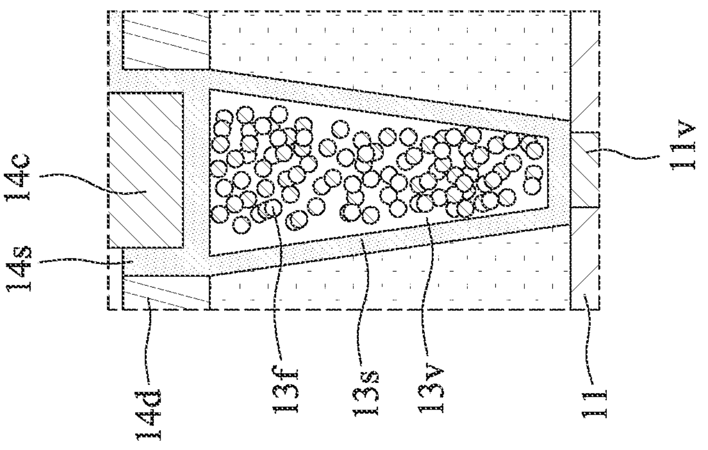
FIG. 1E illustrates a cross-sectional view of an example of a part of an electronic device according to some arrangements of the present disclosure.
Figure 1D:
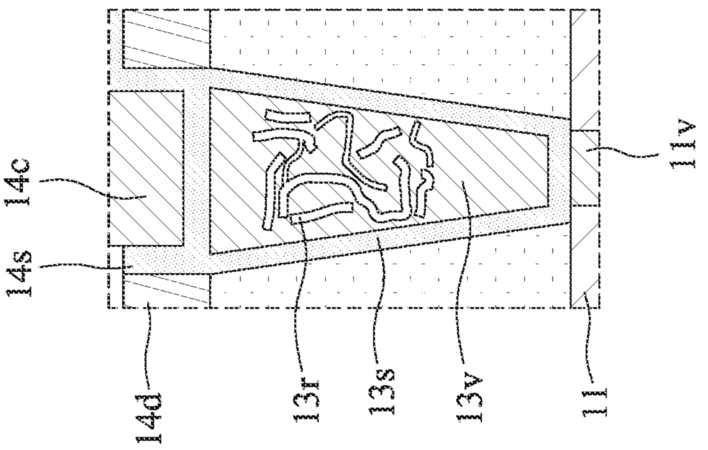
FIG. 1D illustrates a cross-sectional view of an example of a part of an electronic device according to some arrangements of the present disclosure.
Figure 1C:
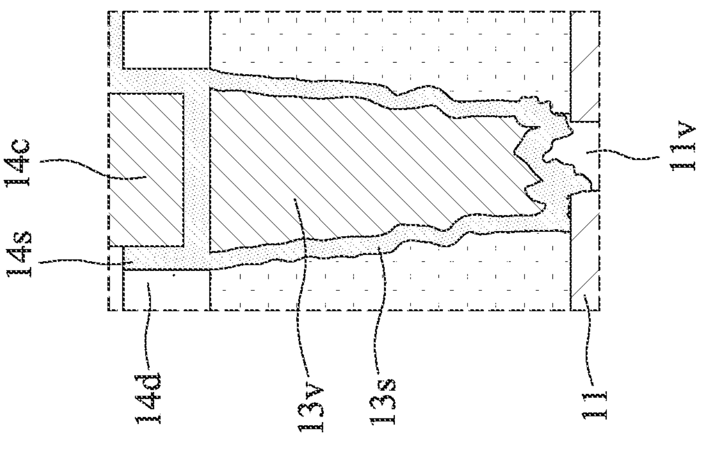
FIG. 1C illustrates a cross-sectional view of an example of a part of an electronic device according to some arrangements of the present disclosure.

FIG. 1C illustrates a cross-sectional view of an example of a part of an electronic device according to some arrangements of the present disclosure. In some arrangements, the structure illustrated in FIG. 1C may be a part of the electronic device 1*a* in FIG. 1A.

The sidewall and the bottom surface of the conductive element 13*v* may be uneven, irregular, or rough. The seed layer 13*s* disposed along the sidewall and the bottom surface of the conductive element 13*v* may also be uneven, irregular, or rough.

Figure 5D:
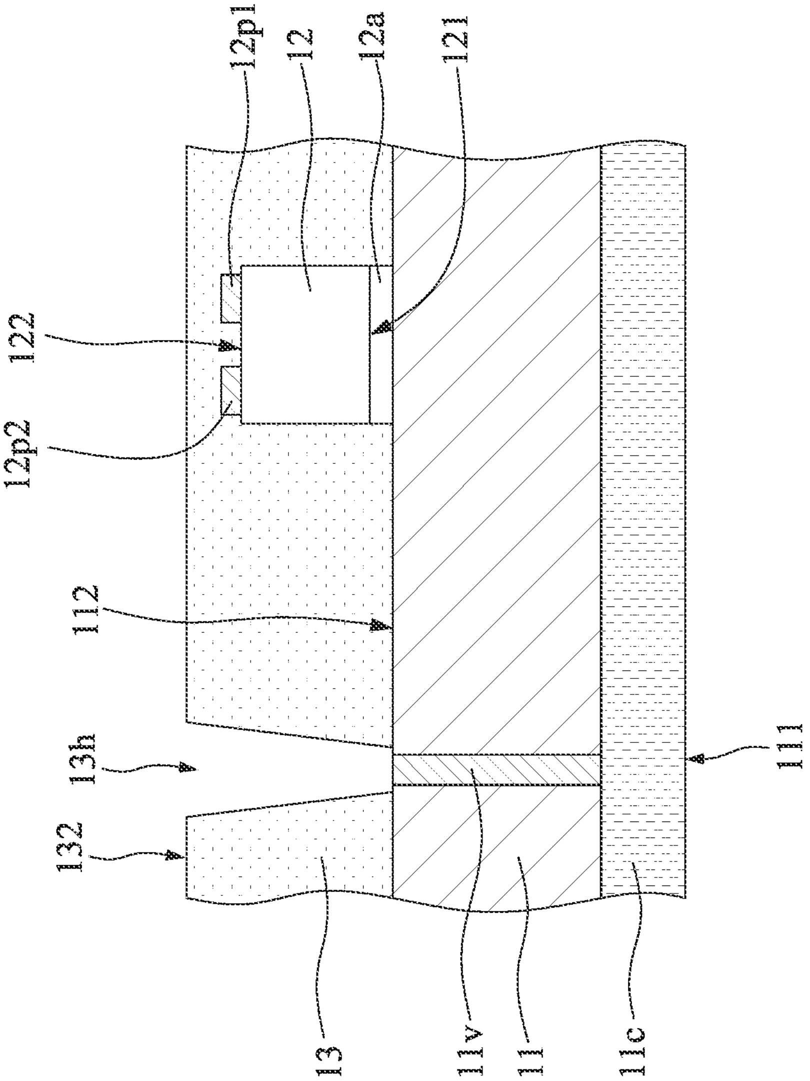

In some arrangements, when forming a through hole for accommodating the conductive element 13*v* in the supporting element 13 through a laser drilling operation (such as shown in FIG. 5D), the supporting element 13 may be partially removed and may cause an uneven formation of the through hole. The seed layer 13*s* may be disposed along the uneven surface. After the conductive material is disposed in the through hole, an uneven, irregular, or rough surface of the conductive element 13*v* can be obtained.

FIG. 1D illustrates a cross-sectional view of an example of a part of an electronic device according to some arrangements of the present disclosure. In some arrangements, the structure illustrated in FIG. 1D may be a part of the electronic device 1*a* in FIG. 1A.

The conductive element 13*v* may have one or more holes or apertures 13*r*. The dimensions and shapes of the apertures 13*r* may be irregular. In some arrangements, when disposing the conductive material in the opening to form the conductive element 13*v* (such as shown in FIG. 5F), a copper (Cu) paste may be injected, filled or printed into the opening of the supporting element 13. A centrifugation process may be performed to remove solvent from the Cu paste and improve Cu particle packing. The conductive element 13*v* can be sintered (such as at higher than 200° C.) in a reducing environment to achieve good sintering while minimizing inherent shrinkage. As a result, the conductive element 13*v* having the apertures 13*r* can be obtained.

FIG. 1E illustrates a cross-sectional view of an example of a part of an electronic device according to some arrangements of the present disclosure. In some arrangements, the structure illustrated in FIG. 1E may be a part of the electronic device 1*a* in FIG. 1A.

In some arrangements, when disposing the conductive material in the opening to form the conductive element 13*v* (such as shown in FIG. 5F), a silver (Ag) paste may be injected, filled, or printed into the opening of the supporting element 13. The Ag paste may be mixed with resin, conductive particles 13*f*, and a curing agent. The conductive element 13*v* can be cured (such as at less than 200° C.) to increase uniformity and density, thereby reducing electrical resistivity. As a result, the conductive element 13*v* having the conductive particles 13*f* can be obtained.

In some arrangements, the structures shown in FIGS. 1C, 1D and 1E may be combined with each other or may be observed in the same electronic device.

Figure 2:
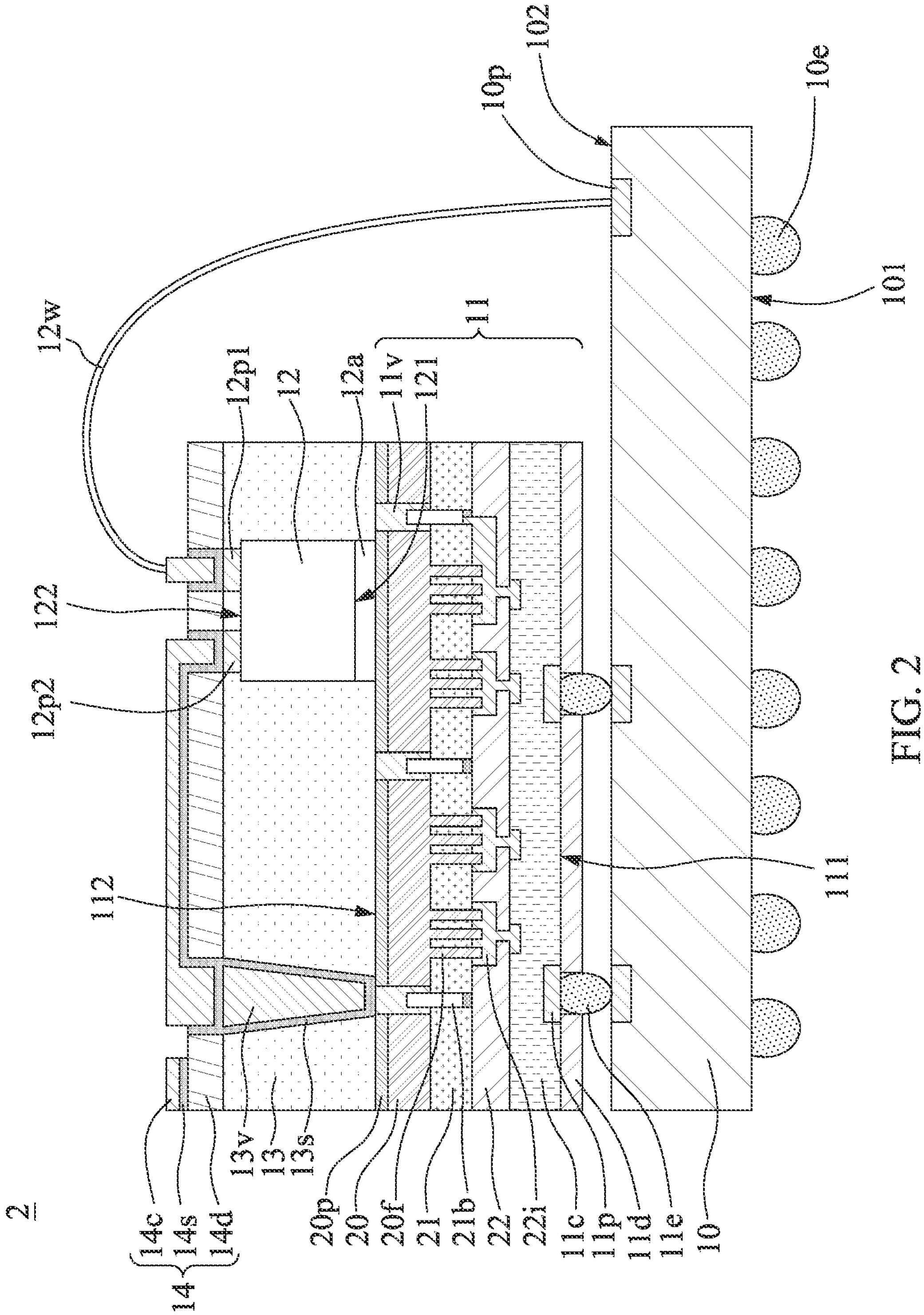
FIG. 2 illustrates a cross-sectional view of an example of an electronic device according to some arrangements of the present disclosure.

FIG. 2 illustrates a cross-sectional view of an example of an electronic device 2 according to some arrangements of the present disclosure. The electronic device 2 is similar to the electronic device 1*a* in FIG. 1A. Therefore, some detailed descriptions may refer to the corresponding paragraphs above and are not repeated hereinafter for conciseness.

The power delivery circuit of the electronic device 2 may include a device substrate (such as a silicon substrate) 20 and a passivation layer 20*p* disposed over the device substrate 20. The one or more conductive elements 11*v* (which may be TSVs) may be formed in the device substrate 20. A plurality of fin structures 20*f* of finFET transistors may be etched in the device substrate 20. The fin structures 20*f* may be surrounded by a shallow trench isolation (STI) oxide layer 21. A plurality of buried power and ground rails 21*b* may be disposed in the STI oxide layer 21. The buried power and ground rails 21*b* may be arranged essentially parallel to the fin structures 20*f*. At least some of the source and drain areas of the finFET transistors may be connected to the buried power and ground rails 21*b* through local interconnects 22*i*. The local interconnects 22*i* may be metal areas placed transversally to the fin structures 20*f*. The local interconnects 22*i* may be embedded in a dielectric layer 22, within which the circuit region 11*c* is built. For example, the local interconnects 22*i* may be electrically connected with the circuit region 11*c*.

Figure 3:
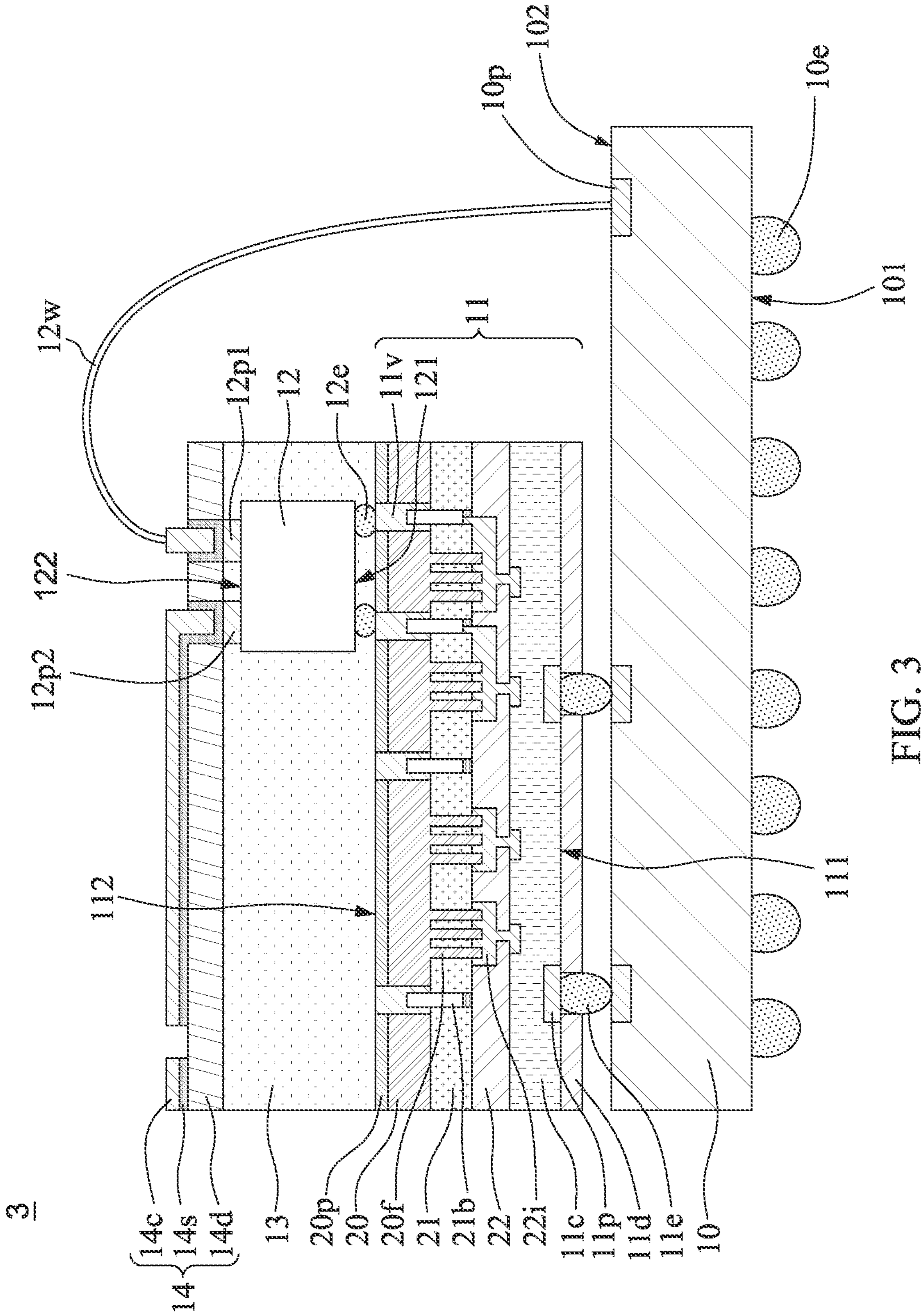
FIG. 3 illustrates a cross-sectional view of an example of an electronic device according to some arrangements of the present disclosure.

FIG. 3 illustrates a cross-sectional view of an example of an electronic device 3 according to some arrangements of the present disclosure. The electronic device 3 is similar to the electronic device 2 in FIG. 2. Therefore, some detailed descriptions may refer to the corresponding paragraphs above and are not repeated hereinafter for conciseness.

The power regulating device 12 may be electrically connected with the conductive element 11*v* through an electrical contact 12*e*. In some arrangements, the electrical contact 12*e* may include a connector In some arrangements, the electrical contact 12*e* may include a solder ball, such as a controlled collapse chip connection (C4) bump, a ball grid array (BGA) or a land grid array (LGA). In some arrangements, the electrical contact 12*e* may be disposed between the conductive element 11*v* and the surface 121 of the power regulating device 12.

The power regulating device 12 may be configured to receive a power signal from a power source through the carrier 10, the conductive element 12*w*, and the interconnection structure 14. The power regulating device 12 may regulate the power signal and provide a regulated power signal to the electronic component 11 through the electrical contact 12*e*. In some arrangements, the electrical contact 12*e* may be configured to receive a power signal from the surface 122, regulate the power signal and provide a regulated power signal to the electronic component 11 through the surface 121. Therefore, the conductive element 13*v* in FIG. 2 may be omitted. The power regulating device 12 may be directly electrically connected with the conductive element 11*v* without the conductive element 13*v*. In some arrangements, the power regulating device 12 may have a conductive element connecting the electrical contact 12*e* and the conductive pad 12*p*1 and/or a conductive element connecting the electrical contact 12*e* and the conductive pad 12*p*2. The conductive element may include a conductive via (such as a TSV) and/or a conductive pillar.

Figure 4:
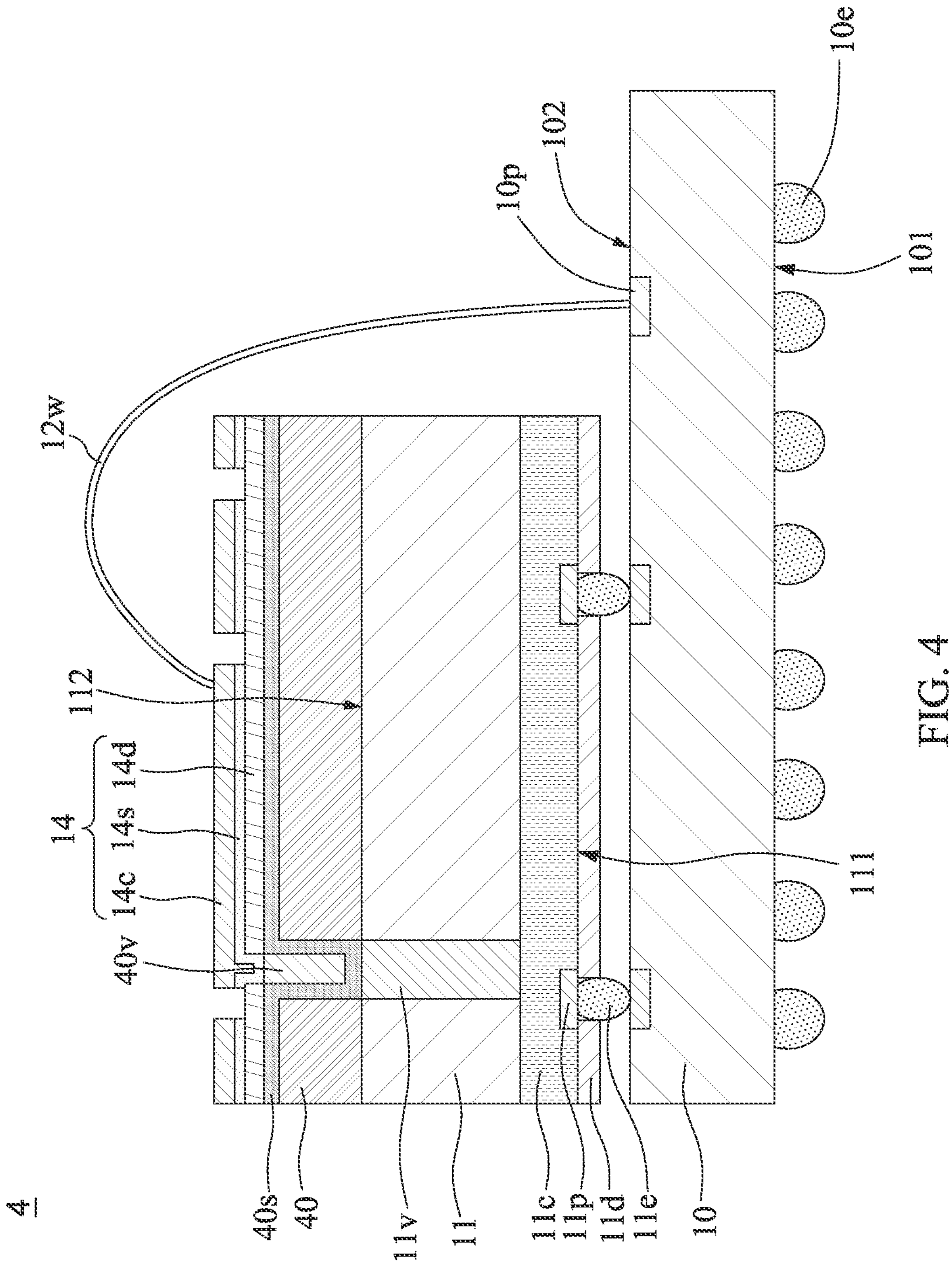
FIG. 4 illustrates a cross-sectional view of an example of an electronic device according to some arrangements of the present disclosure.

FIG. 4 illustrates a cross-sectional view of an example of an electronic device 4 according to some arrangements of the present disclosure. The electronic device 4 is similar to the electronic device 1*a* in FIG. 1A. Therefore, some detailed descriptions may refer to the corresponding paragraphs above and are not repeated hereinafter for conciseness.

Figure 6A:
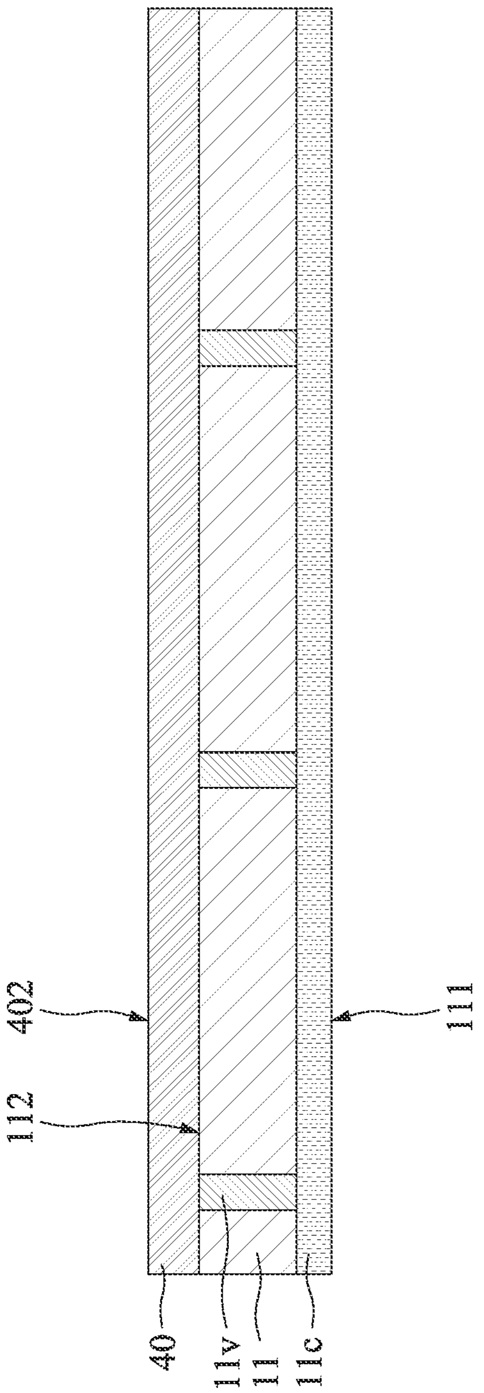
FIG. 6A, 6B, 6C, 6D, 6E, 6F, 6G, 6H, 6I, 6J, 6K, 6L, 6M, and 6N illustrate cross-sectional views in one or more stages of a method of manufacturing an electronic device in accordance with an arrangement of the present disclosure.

The electronic device 4 includes a supporting element 40 to provide structural support and warpage control for the electronic component 11. The supporting element 40 may include a glass or silicon substrate. In an operation (such as shown in FIG. 6A) of forming the supporting element 40, an anodic bonding process may be used to connect silicon/glass through electric fields. In some arrangements, a fusion bonding process may be used to form strong covalent bonds at elevated temperatures or pressures.

In some arrangements, anodic bonding or fusion bonding can create a strong and hermetic bond between two materials, typically glass and silicon. This bond is resistant to mechanical stress, temperature variations, and chemical exposure. Anodic bonding offers high bonding accuracy, allowing precise alignment and bonding of small-scale structures. This is critical when manufacturing micro devices and integrated circuits.

In comparison with the supporting element 13 in FIG. 1A, the supporting element 40 may not encapsulate the power regulating device 12. In addition, the conductive layer 14*c* of the interconnection structure 14 may be connected with the conductive element 40*v* in the supporting element 40. The conductive element 40*v* may include a conductive pillar. A seed layer 40*s* may be disposed along a sidewall and a bottom surface of the conductive element 40*v*. The seed layer 40*s* may be disposed over the supporting element 40.

FIG. 5A, 5B, 5C, 5D, 5E, 5F, 5G, 5H, 5I, 5J, 5K, 5K-1, 5L, 5M, 5N, 5O, 5P, 5Q, 5R, and 5S illustrate cross-sectional views in one or more stages of a method of manufacturing an electronic device in accordance with an arrangement of the present disclosure. At least some of these figures have been simplified to better understand the aspects of the present disclosure. In some arrangements, a part of the electronic device 1*a* may be manufactured through the operations described with respect to FIG. 5A, 5B, 5C, 5D, 5E, 5F, 5G, 5H, 5I, 5J, 5K, 5K-1, 5L, 5M, 5N, 5O, 5P, 5Q, 5R, and 5S.

Referring to FIG. 5A, a substrate may be provided. In some arrangements, the substrate may include several units (such as the electronic components 11) which may be separable from each other by a scribe line or a cut line 50*k*. In some arrangements, the method may be at the wafer level or panel level. In some arrangements, the method may be a wafer-level packaging (WLP). For example, the components are attached to the wafer before the wafer is diced through the cut lines 50*k*. For example, the process of encapsulating the components is on the wafer rather than individually packaging each chip after they are separated from the wafer.

Each electronic component 11 may have the surface 111 and the surface 112 opposite to the surface 111. Each electronic component 11 may have the circuit region 11*c* in proximity to, adjacent to, or disposed over the surface 111. Each electronic component 11 may have one or more conductive elements 11*v*.

Referring to FIG. 5B, the power regulating device 12 may be connected or attached to the electronic component 11 through the adhesive layer 12*a*, such as a glue or epoxy. The power regulating device 12 may include the conductive pads 12*p*1 and 12*p*2 in proximity to, adjacent to, or embedded in and exposed from the surface 122.

Since each electronic component 11 is subjected to similar or identical processes in the manufacturing method, for convenience, only one exemplary electronic component 11 is illustrated in FIG. 5C to FIG. 5R and described in the following description.

Referring to FIG. 5C, the supporting element 13 may be disposed over the surface 112 of the electronic component 11 to cover, encapsulate, or surround the power regulating device 12. In some arrangements, the supporting element 13 may be formed by printing, compressive molding, transfer molding, liquid encapsulant molding, vacuum lamination, spin coating, or other suitable processes. In some arrangements, the supporting element 13 may have a top surface 132 facing away from the electronic component 11.

Referring to FIG. 5D, a through hole 13*h* may be formed in the supporting element 13 by, for example, laser drilling. In some arrangements, the laser drilling operation may cause an uneven, irregular, or rough surface, as shown in FIG. 1C.

Figure 5E:
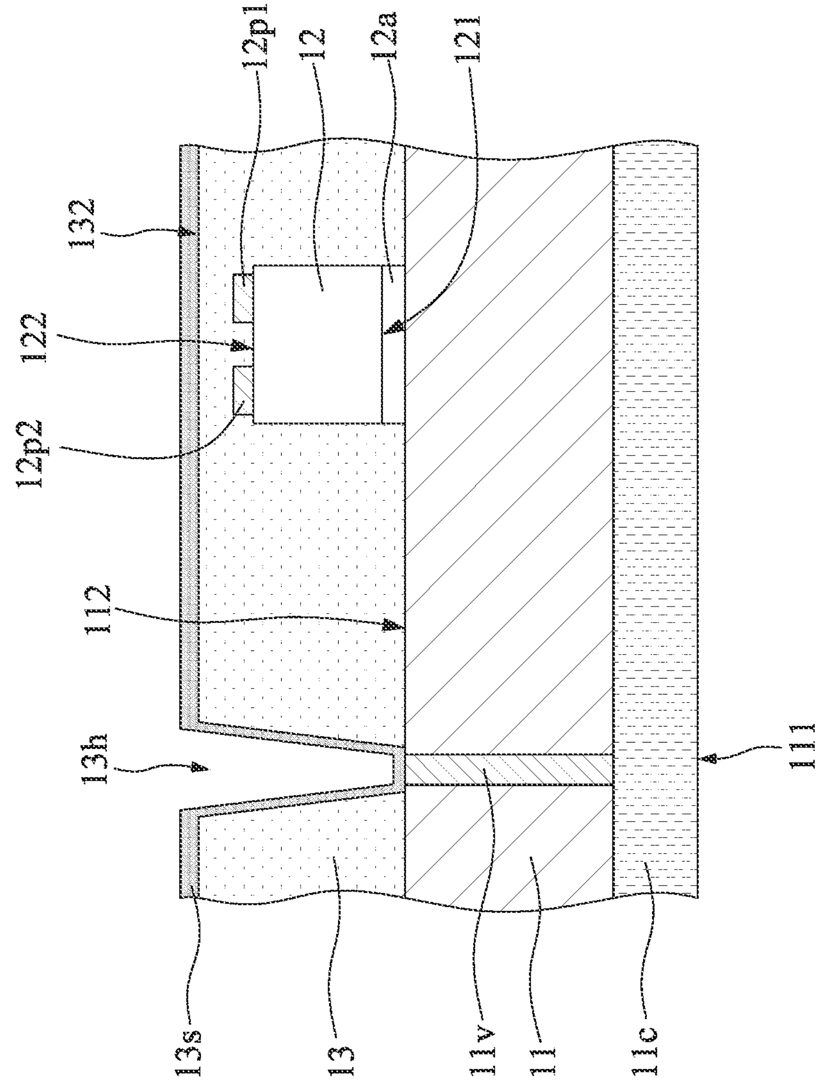
Figure 5F:
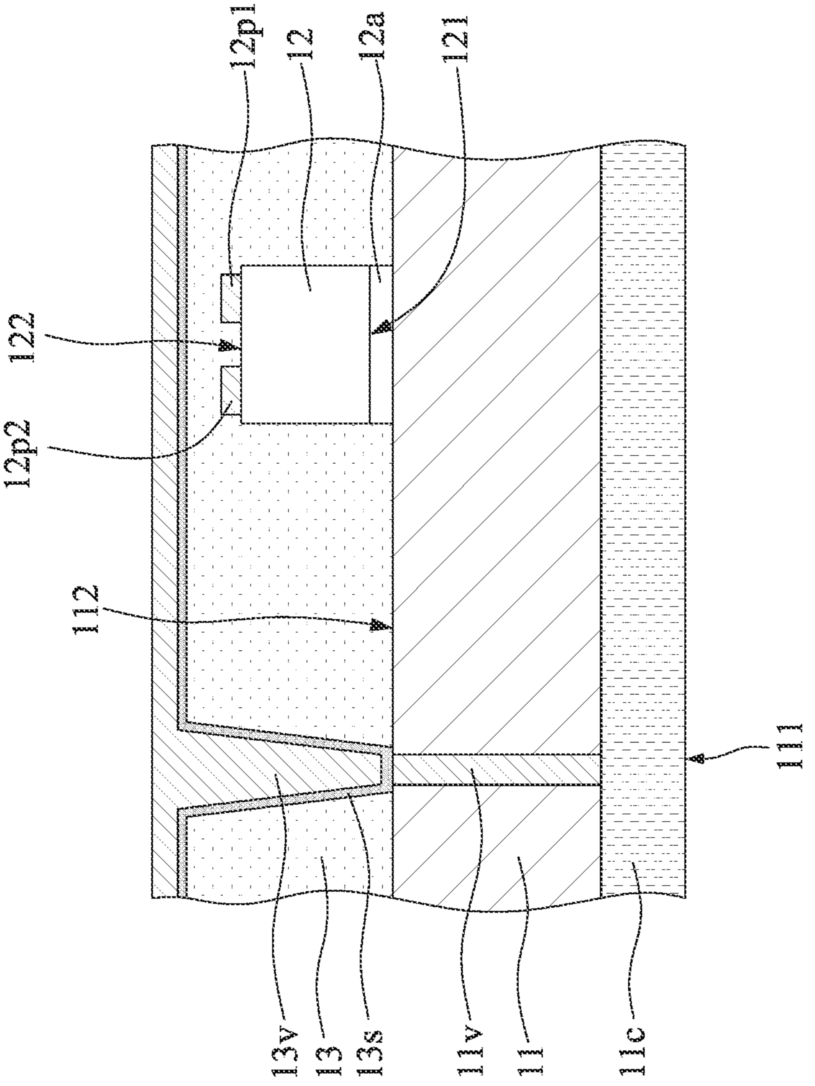

Referring to FIG. 5E, the seed layer 13*s* may be disposed along a sidewall and a bottom surface of the through hole 13*h*. The seed layer 13*s* may be disposed over the top surface 132 of the supporting element 13. The seed layer 13*s* may be formed by sputtering titanium (Ti), copper (Cu), Nickel (Ni), another metal, or an alloy (such as a titanium-tungsten alloy (TiW).

Referring to FIG. 5F, the conductive element 13*v* may be formed by platting conductive materials, such as copper (Cu), tin (Sn), aluminum (Al), gold (Au), silver (Ag), tungsten (W), nickel (Ni), palladium (Pd), other suitable materials, or a combination of two or more thereof. In some arrangements, the conductive element 13*v* may be formed by injecting, filling, or printing a copper (Cu) paste. A centrifugation process may be performed to remove solvent from the Cu paste and improve Cu particle packing. The final structure may have one or more holes or apertures, as shown in FIG. 1D. In some arrangements, the conductive element 13*v* may be formed by injecting, filling, or printing a silver (Ag) paste, which may be mixed with resin, conductive particles, and a curing agent. The final structure may have conductive particles, as shown in FIG. 1E.

Figure 5G:
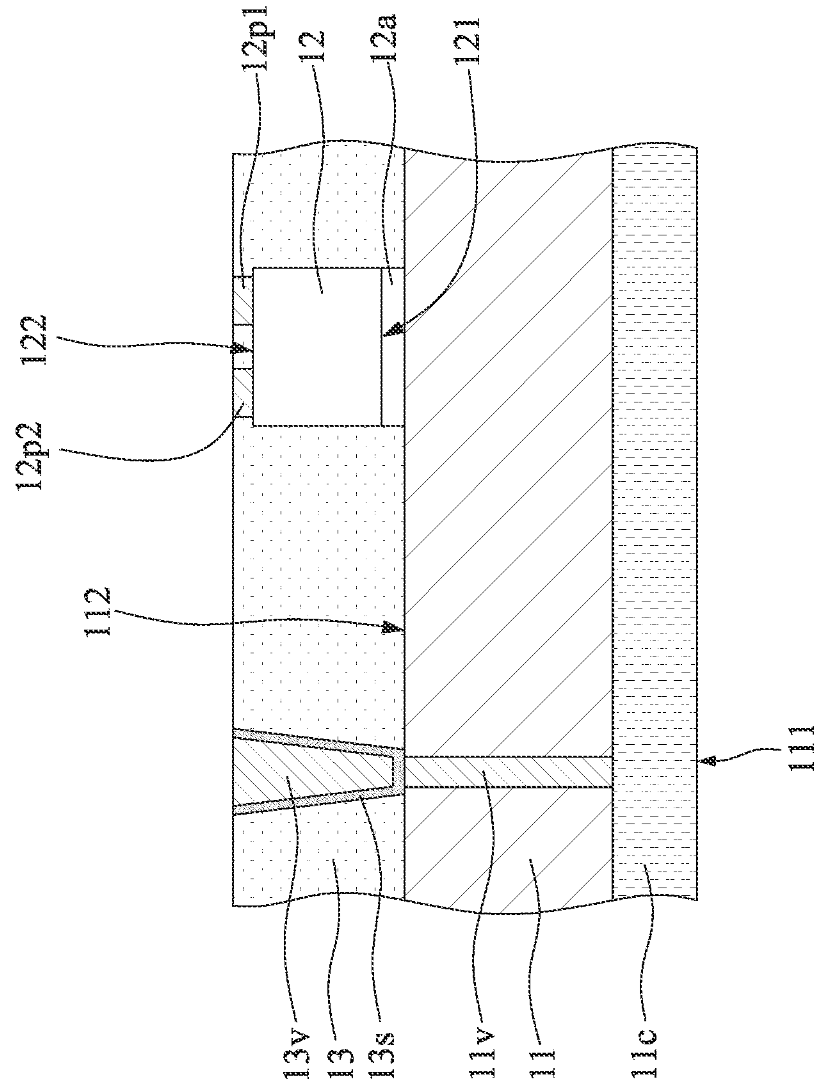

Referring to FIG. 5G, a planarization operation or a grinding operation may be performed to remove at least a portion of the conductive element 13*v*, at least a portion of the seed layer 13*s*, and at least a portion of the supporting element 13. The portion of the conductive element 13*v* that is disposed over the top surface 132 of the supporting element 13 may be removed. The portion of the seed layer 13*s* that is disposed over the top surface 132 of the seed layer 13*s* may be removed. The conductive pads 12*p*1 and 12*p*2 of the power regulating device 12 may be exposed from the supporting element 13.

The planarization operation or grinding operation may include an abrasive machining process that uses a grinding wheel or grinder, a chemical mechanical planarization (CMP) process, an etching process, or a laser direct ablation (LDA) process.

Figure 5H:
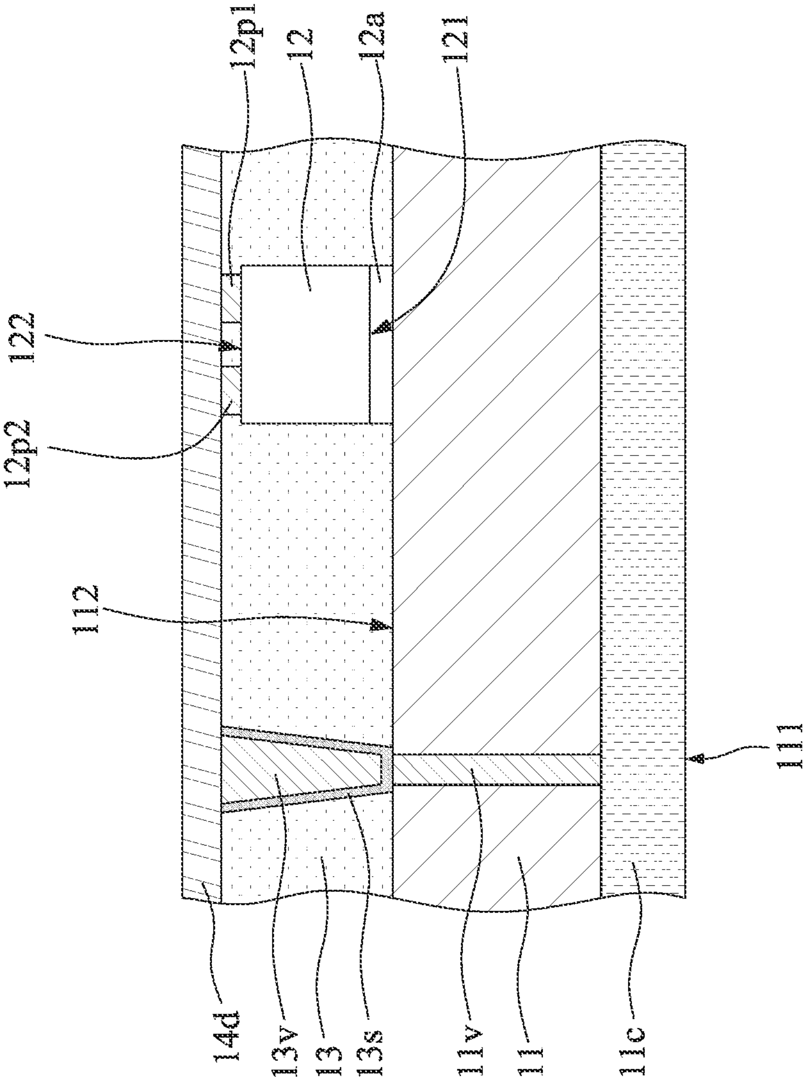

Referring to FIG. 5H, the dielectric layer 14*d* may be disposed over the supporting element 13 and covering the conductive element 13*v* and the conductive pads 12*p*1 and 12*p*2. In some arrangements, the dielectric layer 14*d* may be formed by coating, such as spin-coating. In some arrangements, the dielectric layer 14*d* may include photosensitive material, such as a light-sensitive polymer. In some arrangements, the dielectric layer 14*d* may include a positive photoresist or a negative photoresist.

Figure 5I:
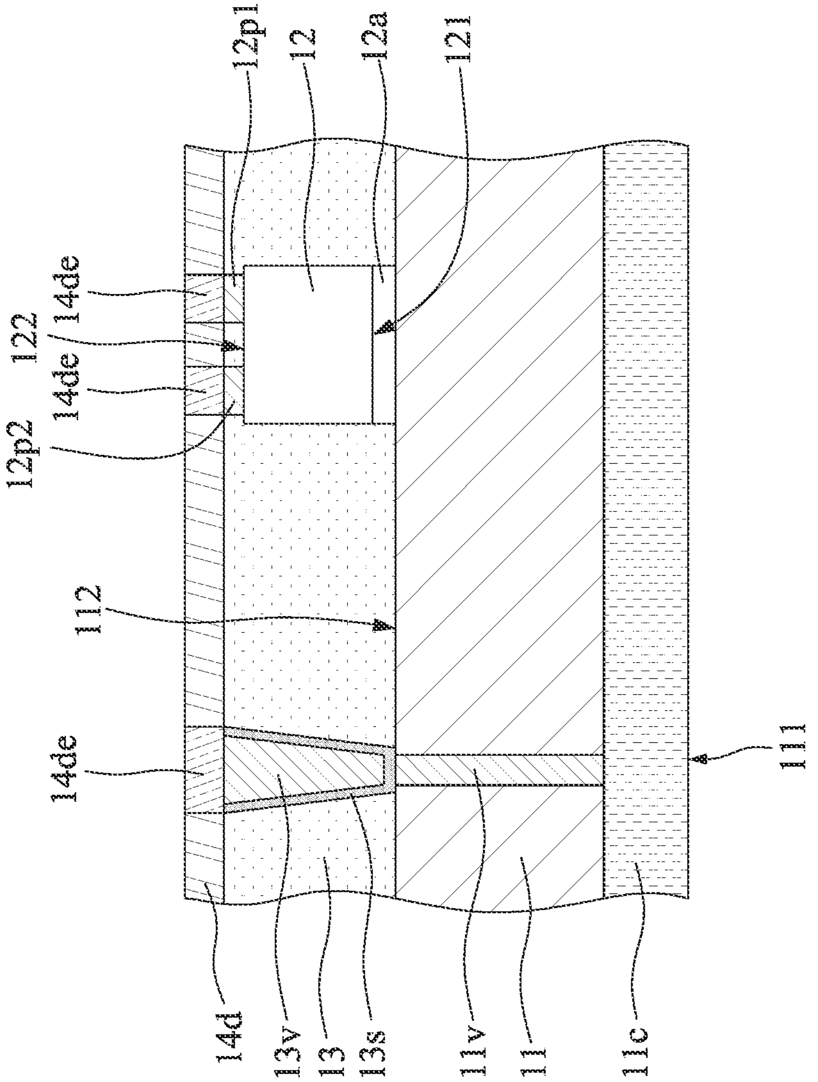

Referring to FIG. 5I, in a photolithography process, the dielectric layer 14*d* may be subjected to a light exposure process. In an arrangement where a positive photoresist is used, when the dielectric layer 14*d* is exposed to light, it undergoes a chemical reaction that increases its solubility in a developer solution. After exposure, the dielectric layer 14*d* is developed using a suitable developer solution, which selectively removes the exposed areas 14*de*, leaving behind the unexposed regions. The remaining patterned dielectric layer 14*d* acts as a protective layer during subsequent etching or deposition processes, allowing the transfer of the pattern onto the underlying substrate.

In an arrangement where a negative photoresist is used, when the dielectric layer 14*d* is exposed to light, it undergoes a chemical reaction that decreases its solubility in a developer solution After exposure, the dielectric layer 14*d* is developed using a suitable developer solution, which selectively removes the unexposed areas, leaving behind the exposed areas 14*de*. The remaining patterned dielectric layer 14*d* acts as a protective layer during subsequent etching or deposition processes, allowing the transfer of the pattern onto the underlying substrate. In summary, positive photoresist becomes soluble and is removed in the exposed areas 14*de* during development, while negative photoresist becomes insoluble and is removed in the unexposed areas during development. The exposed areas 14*de* in FIG. 5I may be removed in an arrangement where a positive photoresist is used. However, the present disclosure is not limited thereto. The choice between positive and negative photoresist depends on the specific requirements of the fabrication process and the desired pattern transfer.

Figure 5J:
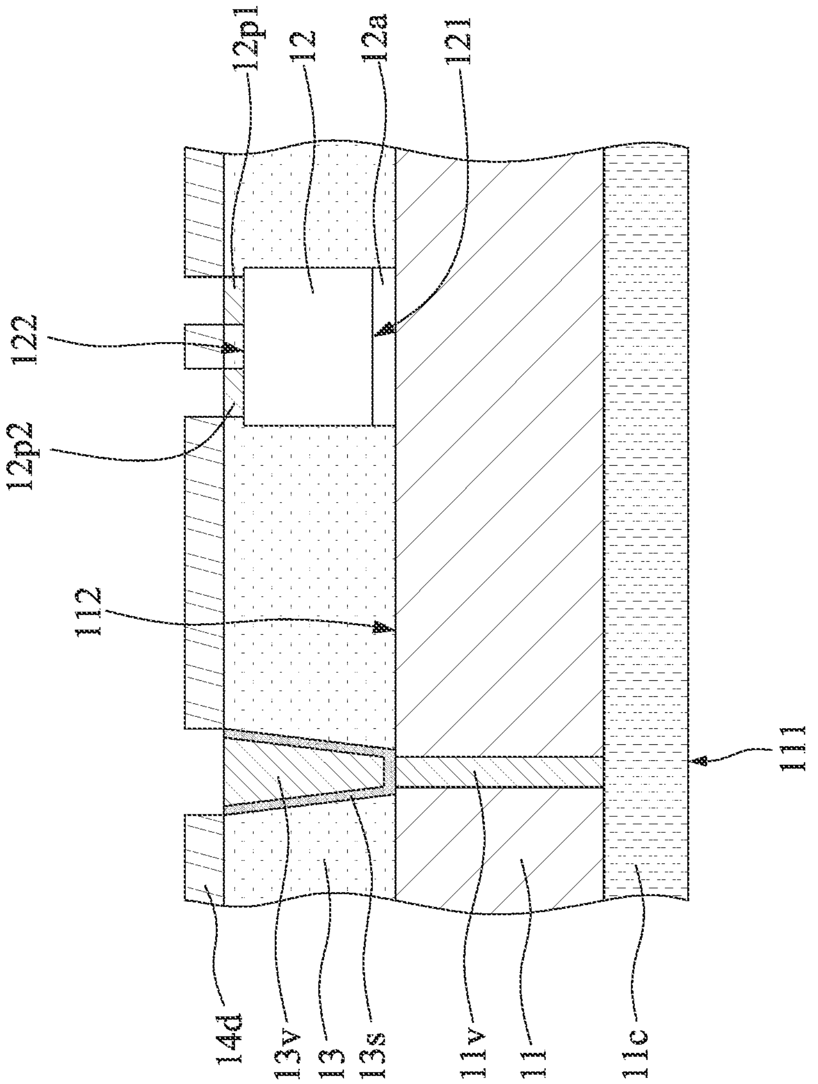
Figure 5K:
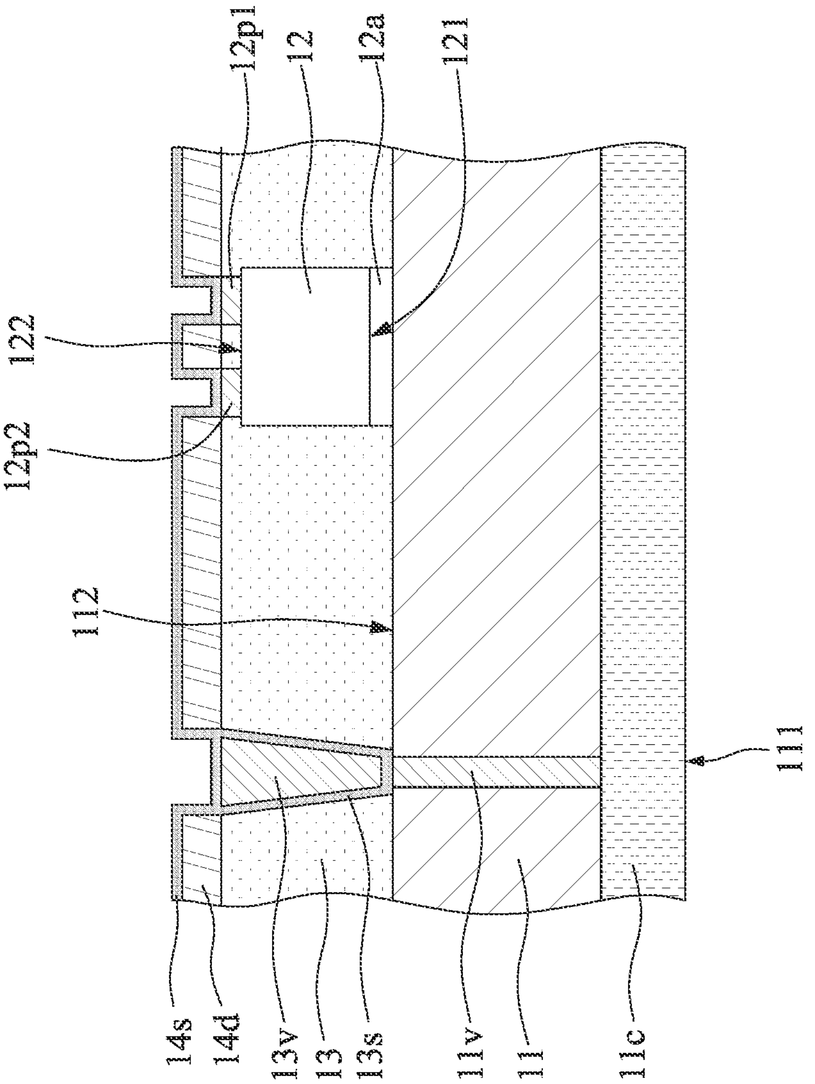
Figures 1, 5K:
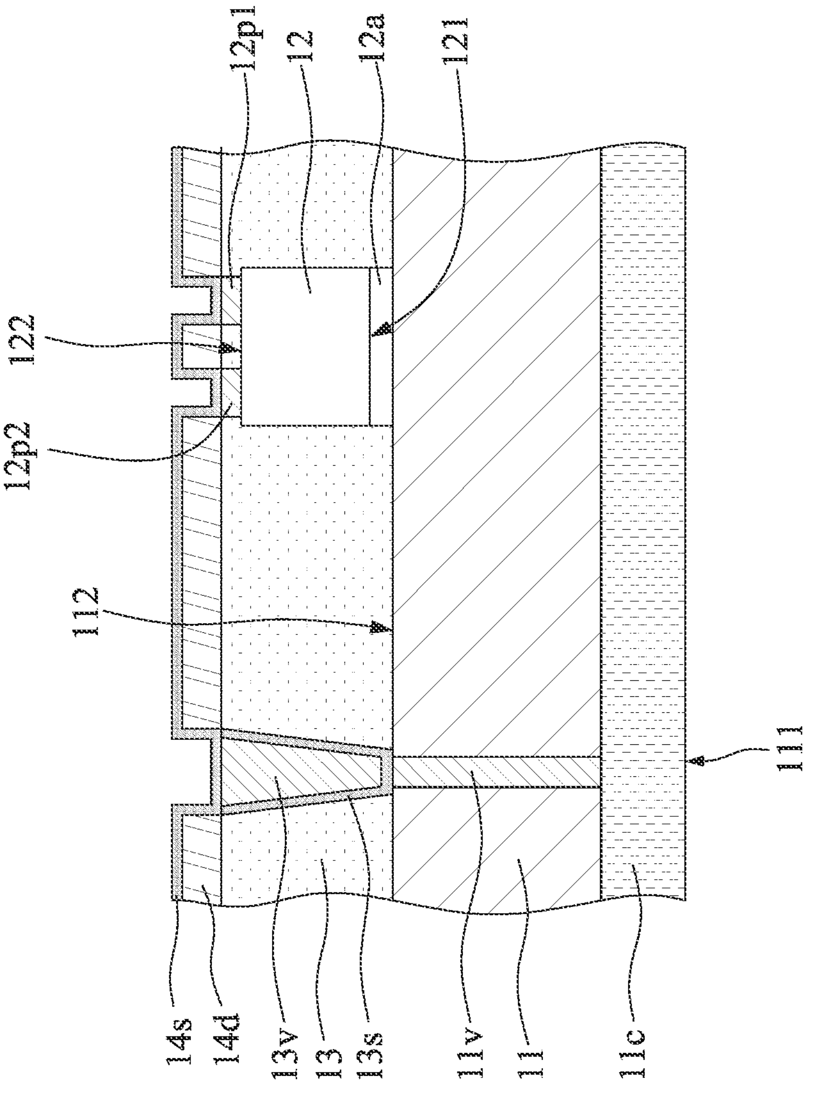

Referring to FIG. 5J, the dielectric layer 14*d* may be developed to remove the exposed areas 14*de* in FIG. 5I. In an arrangement where a negative photoresist is used, the exposed areas 14*de* may remain and the unexposed areas may be removed. One or more openings may be formed to expose the conductive pads 12*p*1 and 12*p*2 of the power regulating device 12, and the conductive element 13*v*.

Referring to FIG. 5K, the seed layer 14*s* may be disposed along the dielectric layer 14*d*. The seed layer 14*s* may be formed by sputtering titanium (Ti), copper (Cu), Nickel (Ni), another metal, or an alloy (such as a titanium-tungsten alloy (TiW). In some arrangements, an interface may be formed between the seed layer 14*s* and the seed layer 13*s*, as shown in FIG. 5K-1.

Figure 5L:
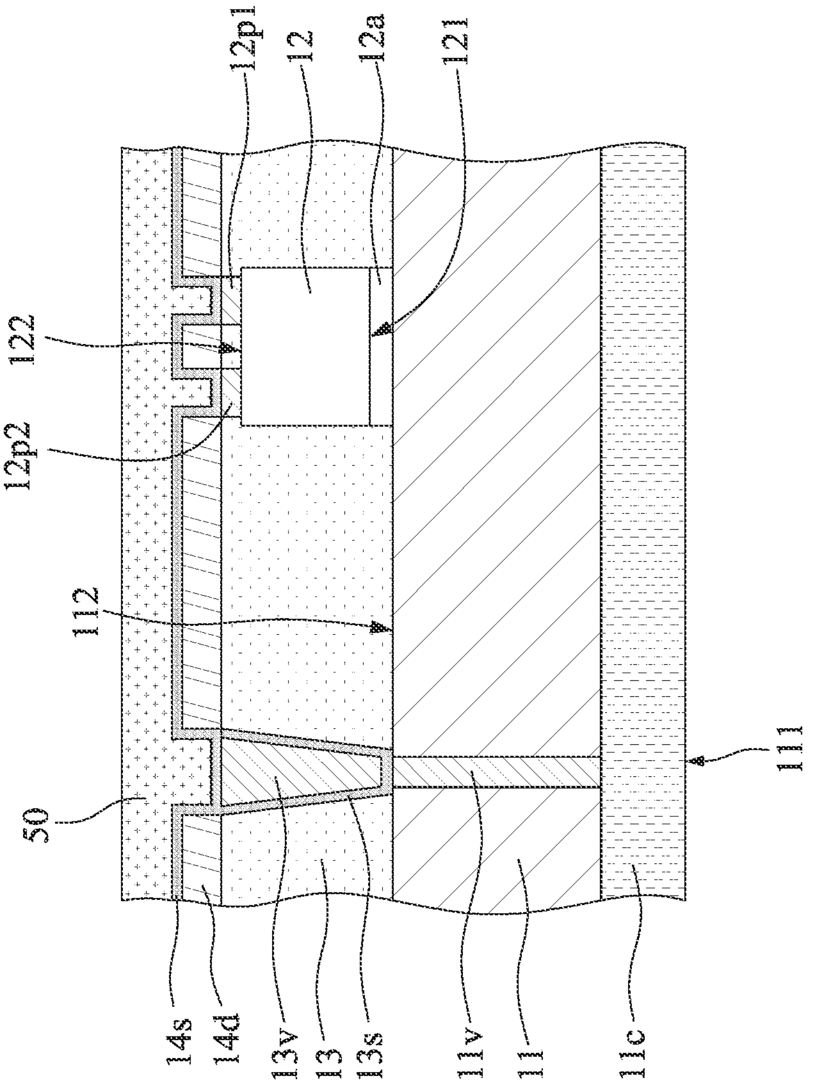

Referring to FIG. 5L, a photosensitive material 50 may be disposed over the dielectric layer 14*d* and covering the seed layer 14*s*. In some arrangements, the photosensitive material 50 may be formed by coating, such as spin-coating. In some arrangements, the photosensitive material 50 may include a positive photoresist or a negative photoresist.

Figure 5M:
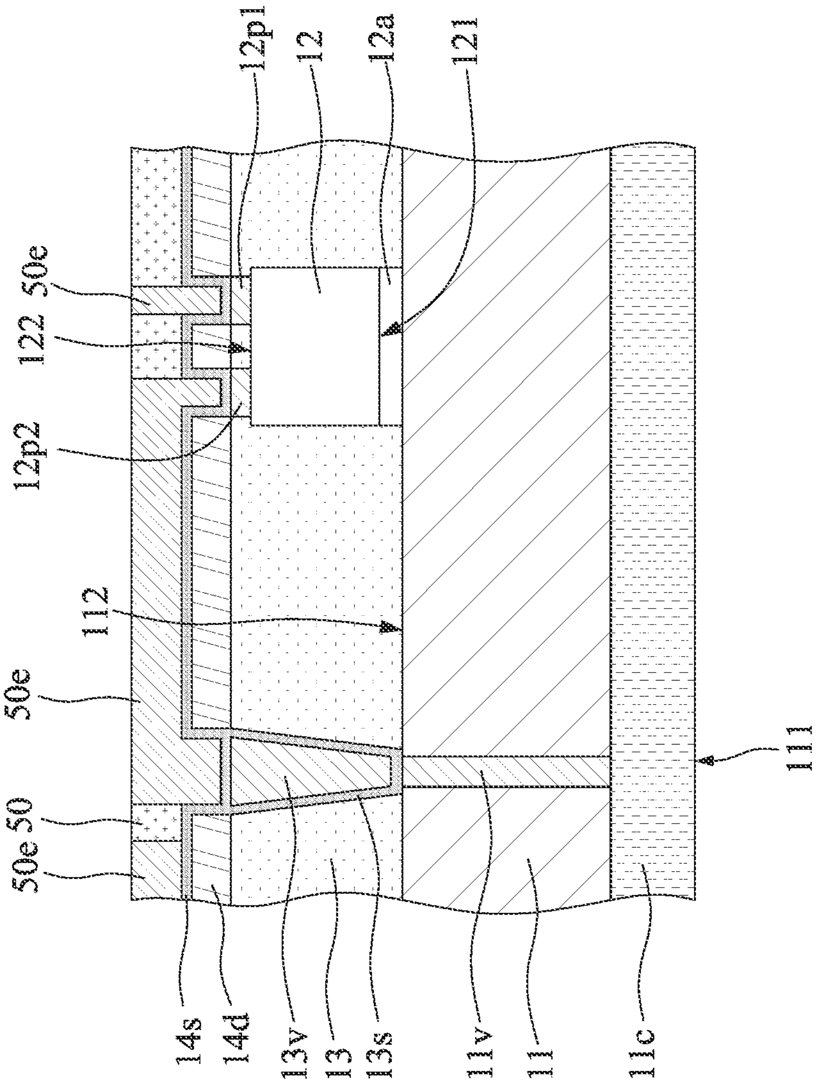

Referring to FIG. 5M, in a photolithography process, the photosensitive material 50 may be subjected to a light exposure process, which may be similar to the light exposure process of FIG. 5I. The exposed areas 50*e* in FIG. 5M may be removed in an arrangement where a positive photoresist is used. However, the present disclosure are not limited thereto. The choice between positive and negative photoresist depends on the specific requirements of the fabrication process and the desired pattern transfer.

Figure 5N:
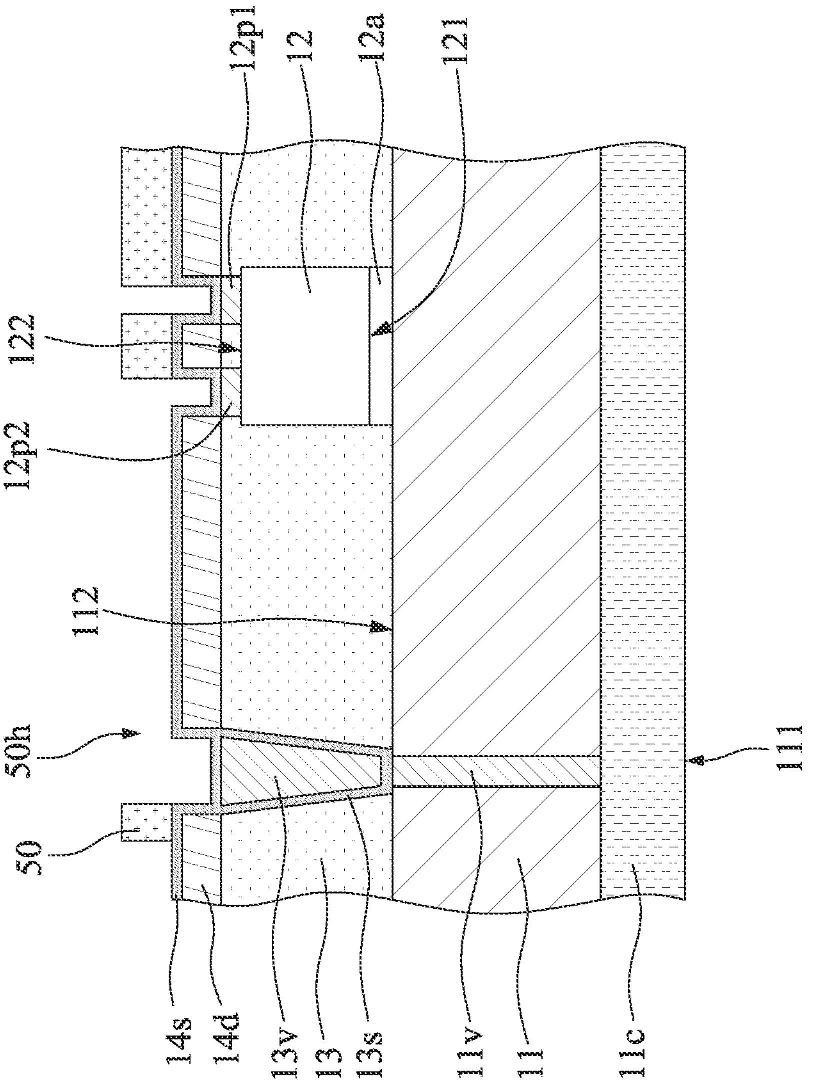

Referring to FIG. 5N, the photosensitive material 50 may be developed to remove the exposed areas 50*e*. In an arrangement where a negative photoresist is used, the exposed areas 50*e* may remain and the unexposed areas may be removed. One or more openings 50*h* may be formed to partially expose the seed layer 14*s*.

Figure 5O:
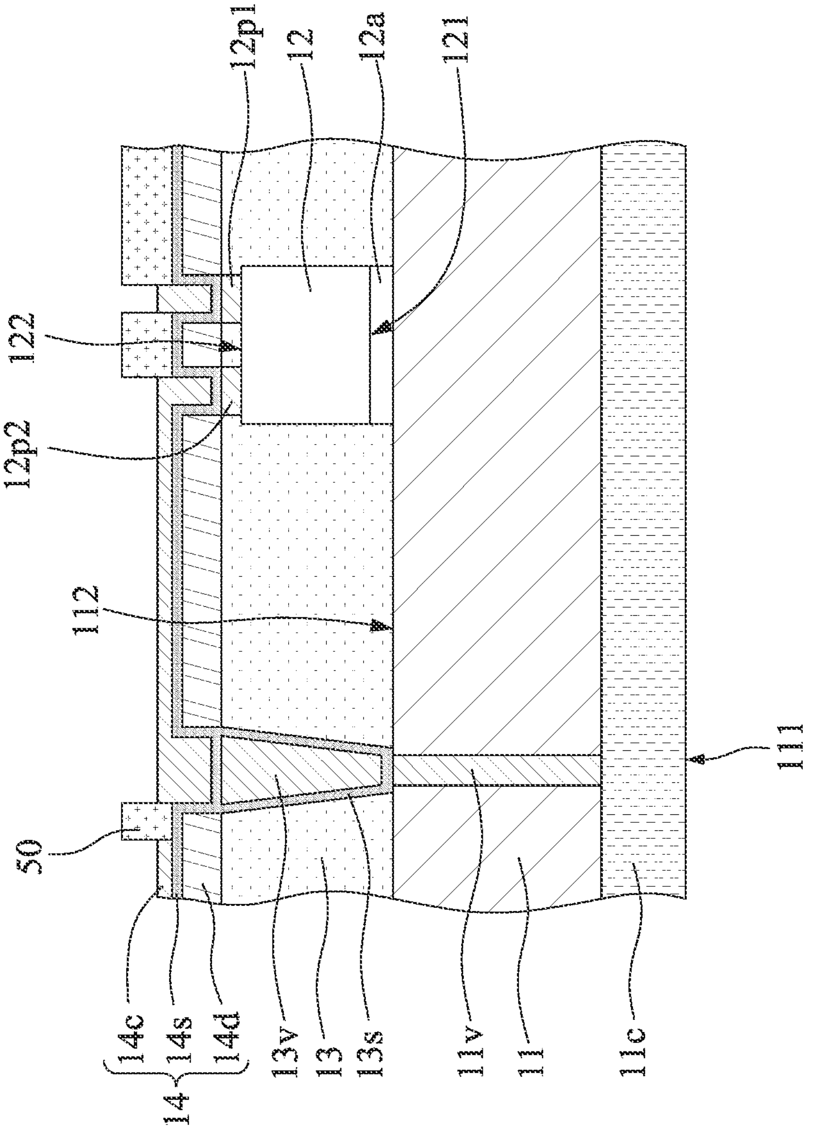

Referring to FIG. 5O, the conductive layer 14*c* may be formed by platting conductive materials, such as copper (Cu), tin (Sn), aluminum (Al), gold (Au), silver (Ag), tungsten (W), nickel (Ni), palladium (Pd), other suitable materials, or a combination of two or more thereof.

Figure 5P:
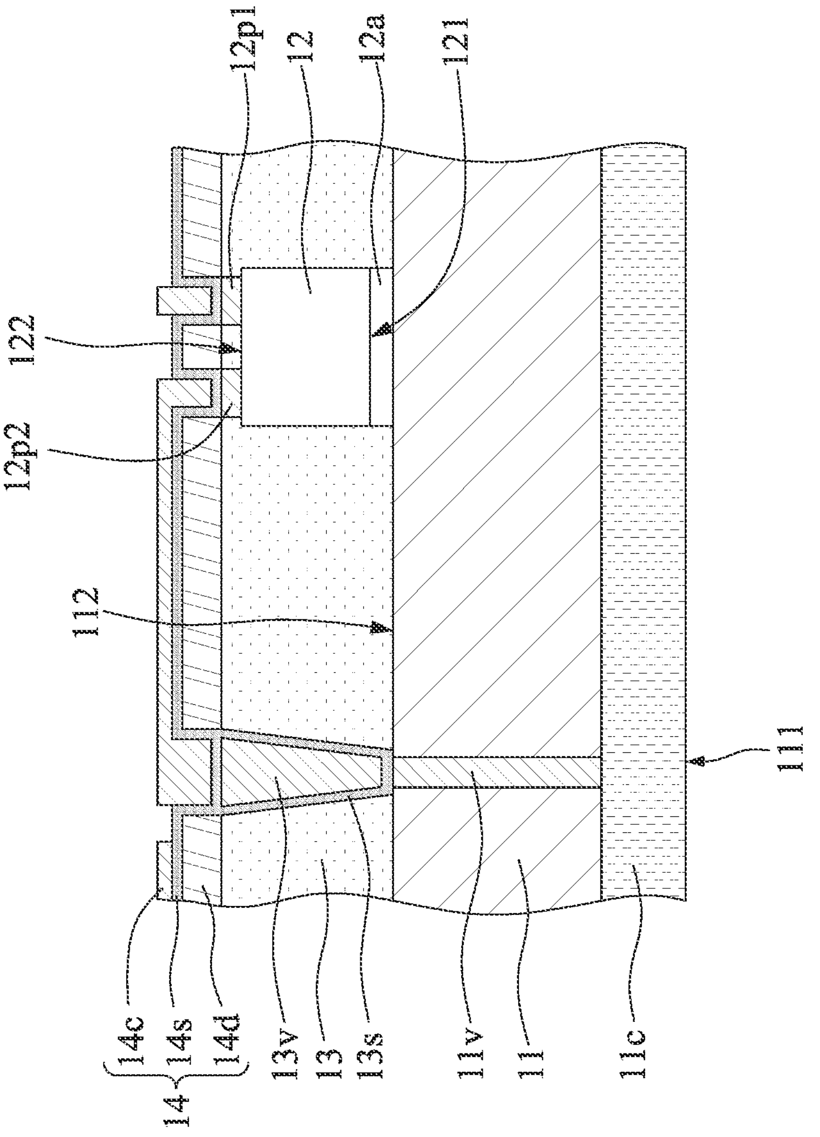

Referring to FIG. 5P, the photosensitive material 50 may be removed using a chemical process, such as resist stripping.

Figure 5Q:
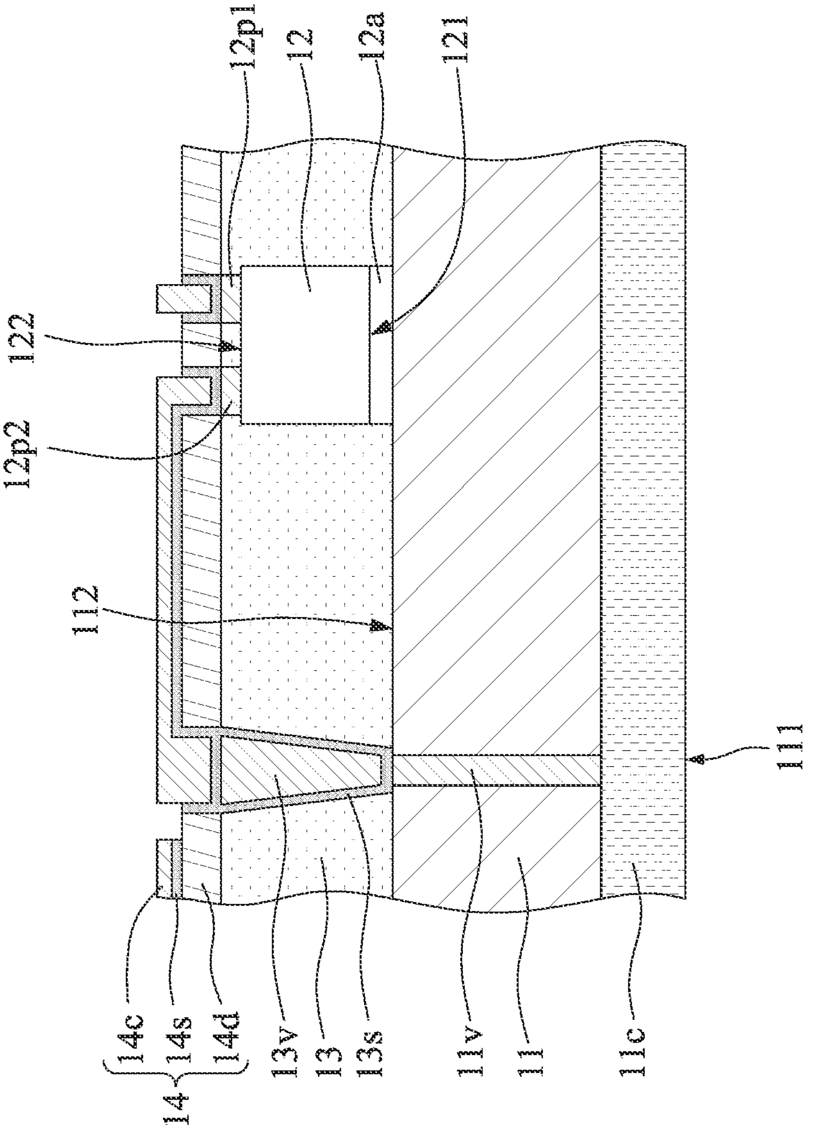
Figure 5R:
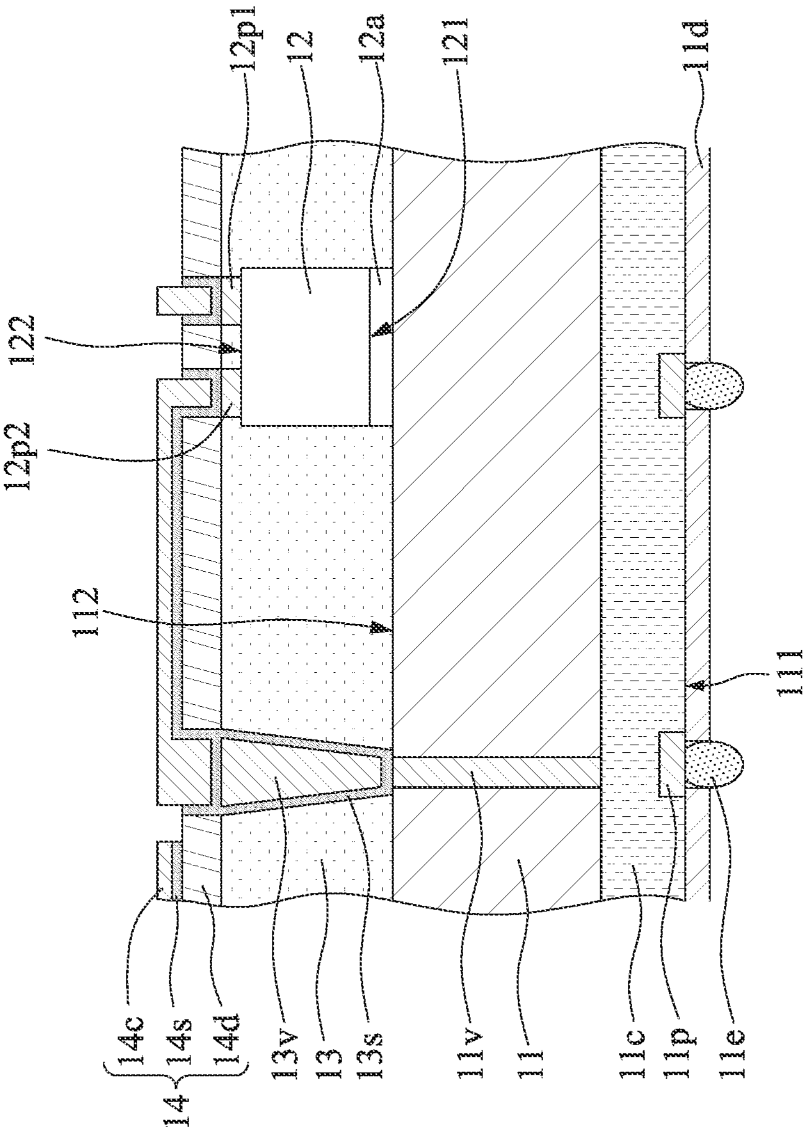
Figure 5S:
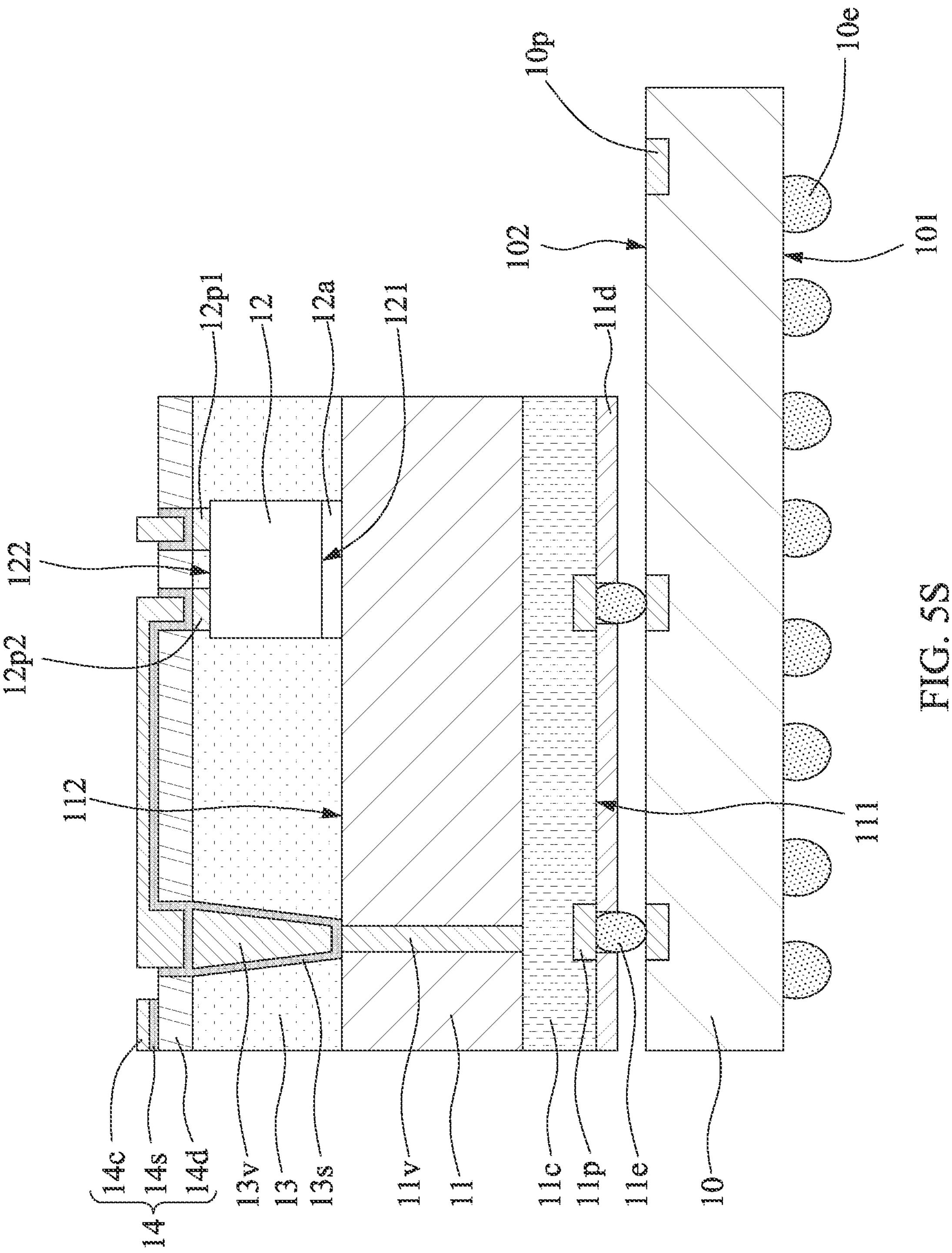

Referring to FIG. 5Q, the seed layer 14*s* that is not covered by the conductive layer 14*c* may be removed with an etchant.

Referring to FIG. 5R, the electrical contact 11*e* may be formed over the circuit region 11*c* in proximity to, adjacent to, or disposed over the surface 111. A singulation may be performed to separate out individual electronic components (or unit chips). The singulation may be performed, for example, by using a dicing saw, laser or other appropriate cutting techniques.

Referring to FIG. 5S, the electronic component 11 may be electrically connected with the carrier 10 through the electrical contact 11*e*. The carrier 10 may be electrically connected with the power regulating device 12 through the conductive element 12*w*. The obtained structure may be similar to the electronic device 1*a* in FIG. 1A.

FIG. 6A, 6B, 6C, 6D, 6E, 6F, 6G, 6H, 6I, 6J, 6K, 6L, 6M, and 6N illustrate cross-sectional views in one or more stages of a method of manufacturing an electronic device in accordance with an arrangement of the present disclosure. At least some of these figures have been simplified to better understand the aspects of the present disclosure. In some arrangements, a part of the electronic device 4 may be manufactured through the operations described with respect to FIG. 6A, 6B, 6C, 6D, 6E, 6F, 6G, 6H, 6I, 6J, 6K, 6L, 6M, and 6N.

The operation of FIG. 6A may be subsequent to the operation of FIG. 5A, and may include disposing the supporting element 40 over the surface 112 of the electronic component 11. In some arrangements, the supporting element 40 may be formed by an anodic bonding process or a fusion bonding process. In some arrangements, the supporting element 40 may have a top surface 402 facing away from the electronic component 11. The supporting element 40 may include a glass or silicon substrate. In some arrangements, the supporting element 40 may include other materials described with respect to the supporting element 13.

Figure 6B:
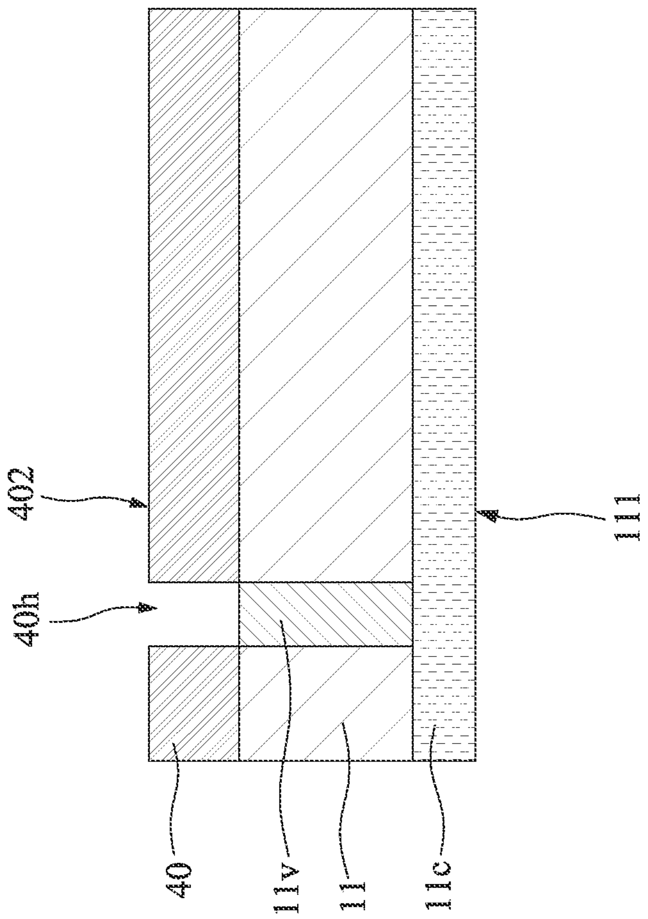

Referring to FIG. 6B, one or more through holes 40*h* may be formed in the supporting element 40 by, for example, laser drilling, an etching process, or another suitable process.

Figure 6C:
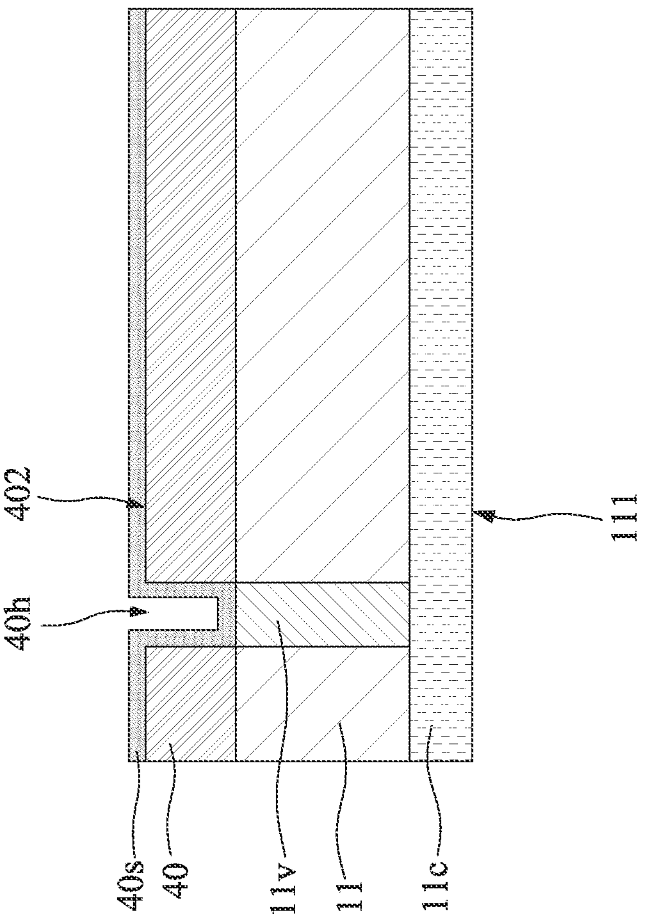

Referring to FIG. 6C, the seed layer 40*s* may be disposed along a sidewall and a bottom surface of the through hole 40*h*. The seed layer 40*s* may be disposed over the top surface 402 of the supporting element 40. The seed layer 40*s* may be formed by sputtering titanium (Ti), copper (Cu), Nickel (Ni), another metal, or an alloy (such as a titanium-tungsten alloy (TiW).

Figure 6D:
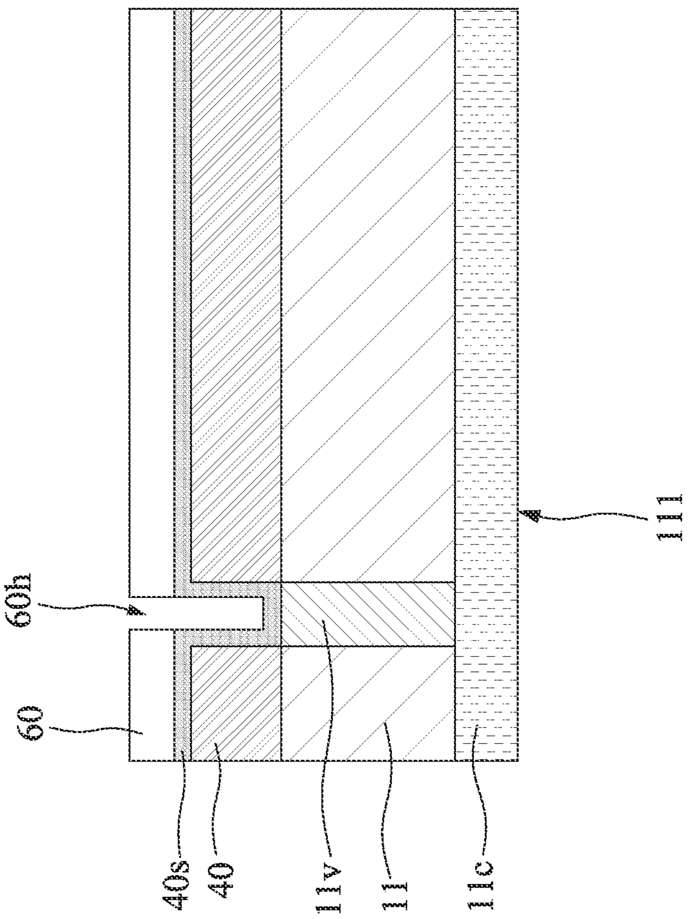

Referring to FIG. 6D, a photosensitive material 60 may be disposed over the seed layer 40*s*. In some arrangements, the photosensitive material 60 may be formed by coating, such as spin-coating. In some arrangements, the photosensitive material 60 may include a positive photoresist or a negative photoresist.

In a photolithography process, the photosensitive material 60 may be subjected to a light exposure process. The photosensitive material 60 may be developed to remove the exposed areas in an arrangement where a positive photoresist is used. The photosensitive material 60 may be developed to remove the unexposed areas in an arrangement where a negative photoresist is used. One or more openings 60*h* may be formed to partially expose the seed layer 40*s*.

Figure 6E:
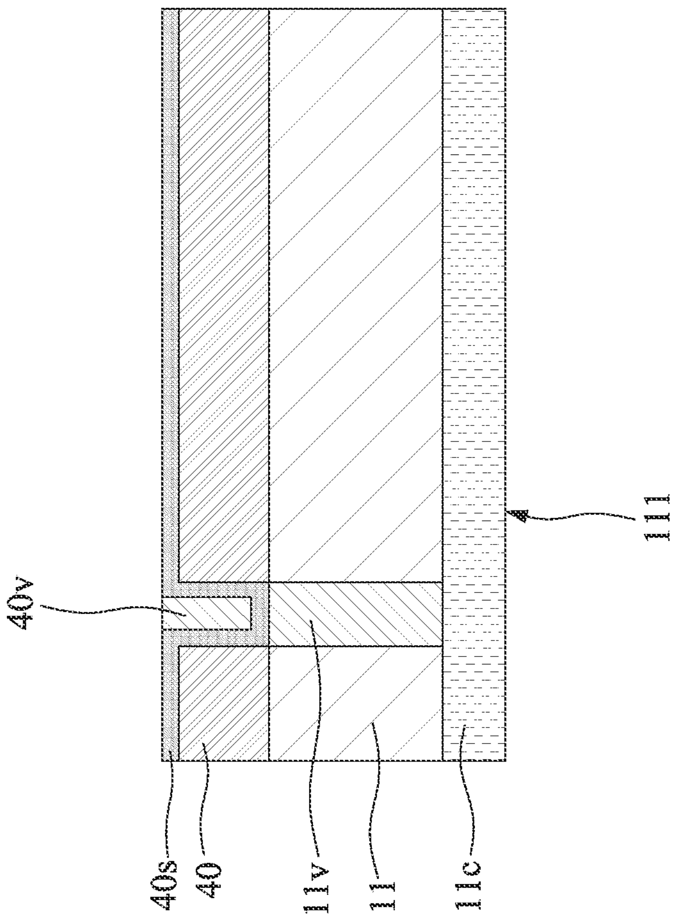

Referring to FIG. 6E, the conductive element 40*v* may be formed by platting conductive materials, such as copper (Cu), tin (Sn), aluminum (Al), gold (Au), silver (Ag), tungsten (W), nickel (Ni), palladium (Pd), other suitable materials, or a combination of two or more thereof.

Figure 6F:
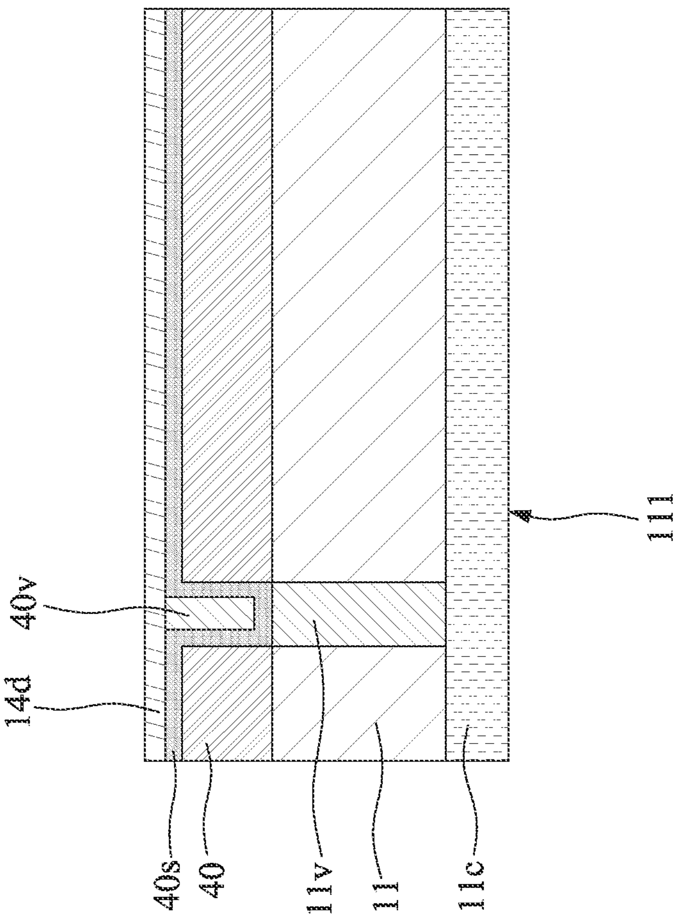

Referring to FIG. 6F, the dielectric layer 14*d* may be disposed over the conductive element 40*v* and the seed layer 40*s*. In some arrangements, the dielectric layer 14*d* may be formed by coating, such as spin-coating. In some arrangements, the dielectric layer 14*d* may include photosensitive material, such as a light-sensitive polymer. In some arrangements, the dielectric layer 14*d* may include a positive photoresist or a negative photoresist.

Figure 6G:
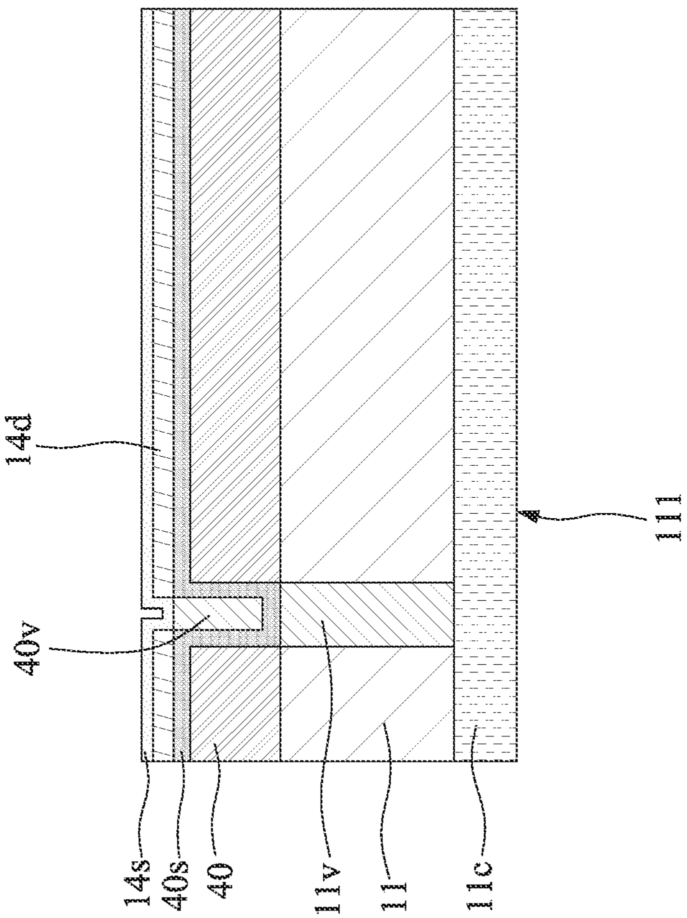

Referring to FIG. 6G, in a photolithography process, the dielectric layer 14*d* may be subjected to a light exposure process. The dielectric layer 14*d* may be developed to remove the exposed areas in an arrangement where a positive photoresist is used. The dielectric layer 14*d* may be developed to remove the unexposed areas in an arrangement where a negative photoresist is used. One or more openings may be formed to expose the conductive element 40*v*. In some arrangements, the openings may be formed by for example, laser drilling, an etching process, or another suitable process. The seed layer 14*s* may be disposed along the dielectric layer 14*d*. In some arrangements, an interface may be formed between the seed layer 14*s* and the conductive element 40*v*.

Figure 6H:
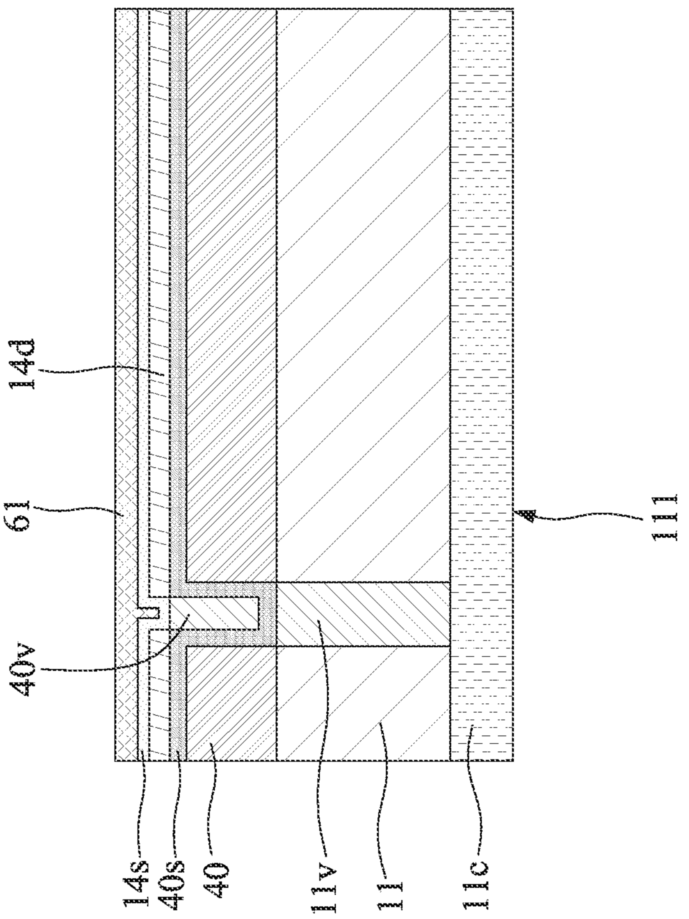

Referring to FIG. 6H, a photosensitive material 61 may be disposed over the seed layer 14*s*. In some arrangements, the photosensitive material 61 may be formed by coating, such as spin-coating. In some arrangements, the photosensitive material 61 may include a positive photoresist or a negative photoresist.

Figure 6I:
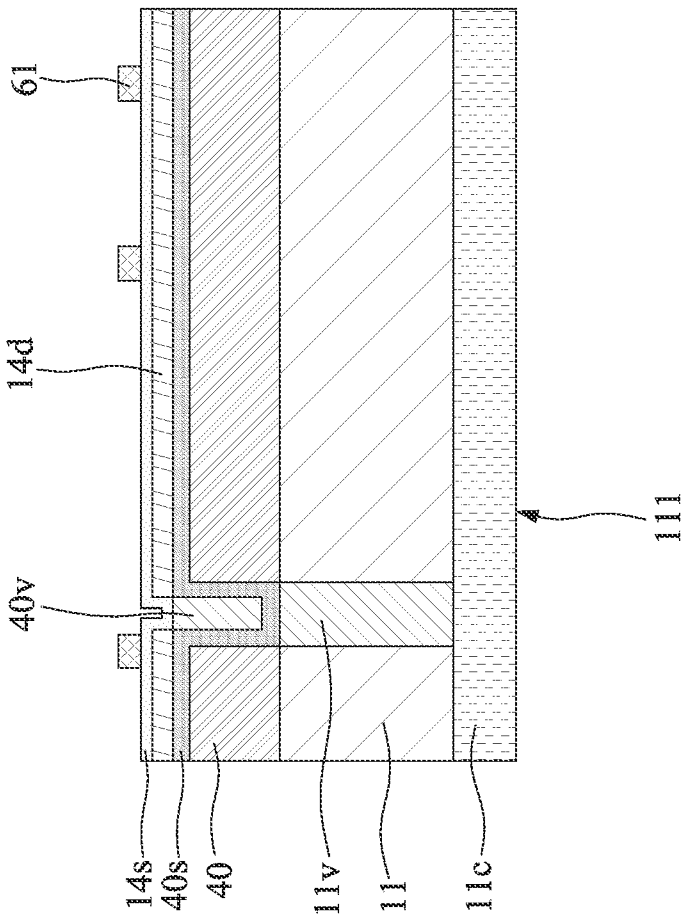

Referring to FIG. 6I, in a photolithography process, the photosensitive material 61 may be subjected to a light exposure process, which may be similar to the light exposure process of FIG. 5I. The exposed areas in FIG. 6I may be removed in an arrangement where a positive photoresist is used. However, the present disclosure are not limited thereto. The choice between positive and negative photoresist depends on the specific requirements of the fabrication process and the desired pattern transfer. One or more openings may be formed to partially expose the seed layer 14*s*.

Figure 6J:
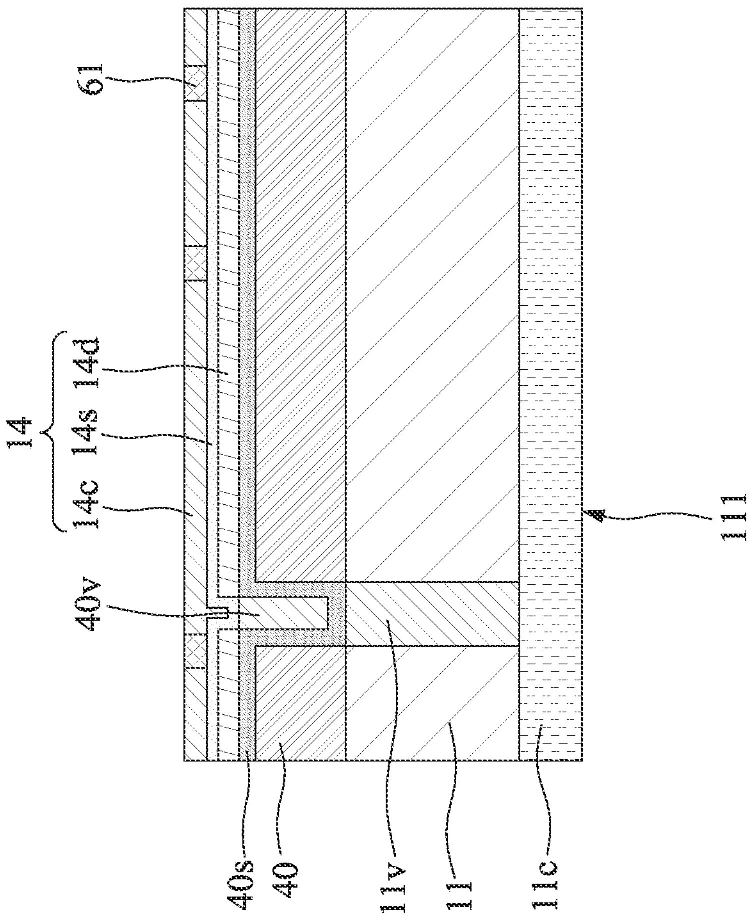

Referring to FIG. 6J, the conductive layer 14*c* may be formed by platting conductive materials, such as copper (Cu), tin (Sn), aluminum (Al), gold (Au), silver (Ag), tungsten (W), nickel (Ni), palladium (Pd), other suitable materials, or a combination of two or more thereof.

Figure 6K:
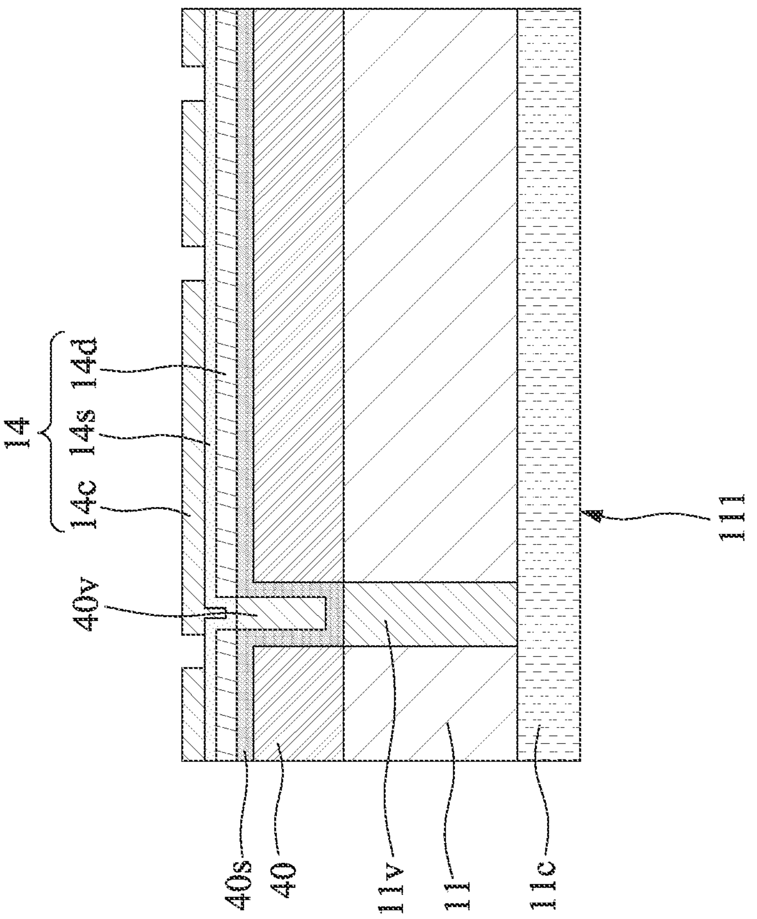

Referring to FIG. 6K, the photosensitive material 61 may be removed using a chemical process, such as resist stripping.

Figure 6L:
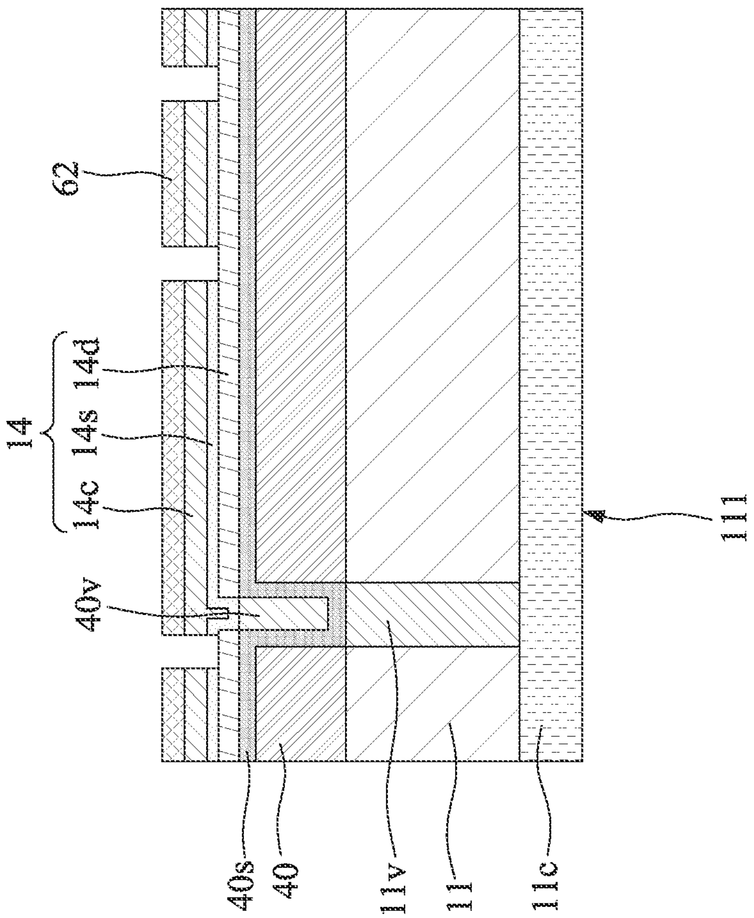

Referring to FIG. 6L, a photosensitive material 62 may be disposed over the conductive layer 14*c*. In a photolithography process, the photosensitive material 62 may be subjected to a light exposure process, which may be similar to the light exposure process of FIG. 5I. One or more openings may be formed to partially expose the seed layer 14*s*. The seed layer 14*s* that is not covered by the photosensitive material 62 may be removed with an etchant.

Figure 6M:
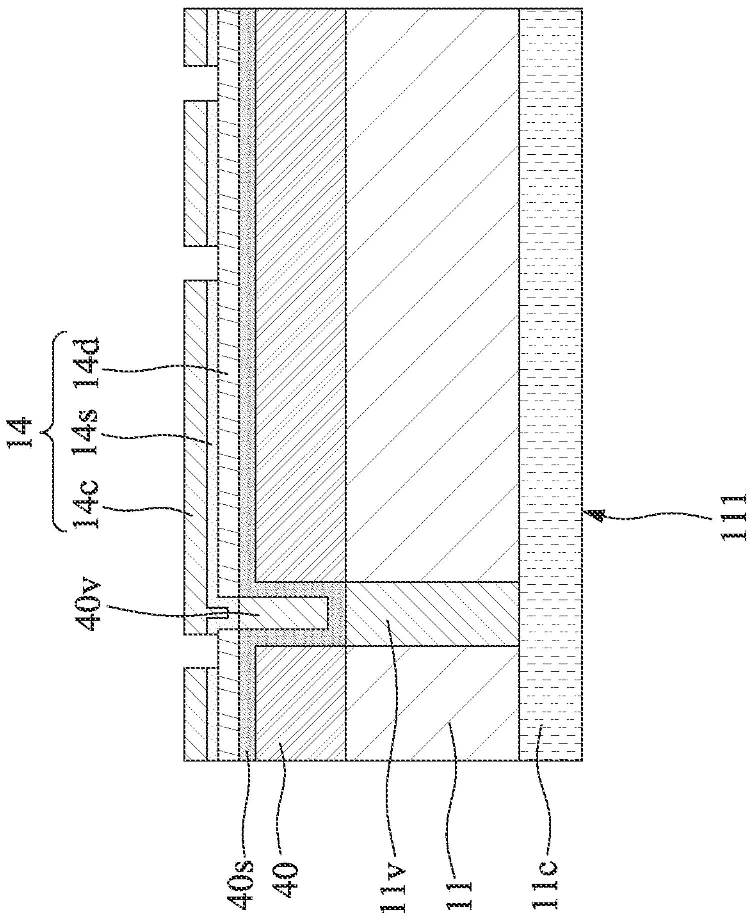

Referring to FIG. 6M, the photosensitive material 62 may be removed using a chemical process, such as resist stripping.

Figure 6N:
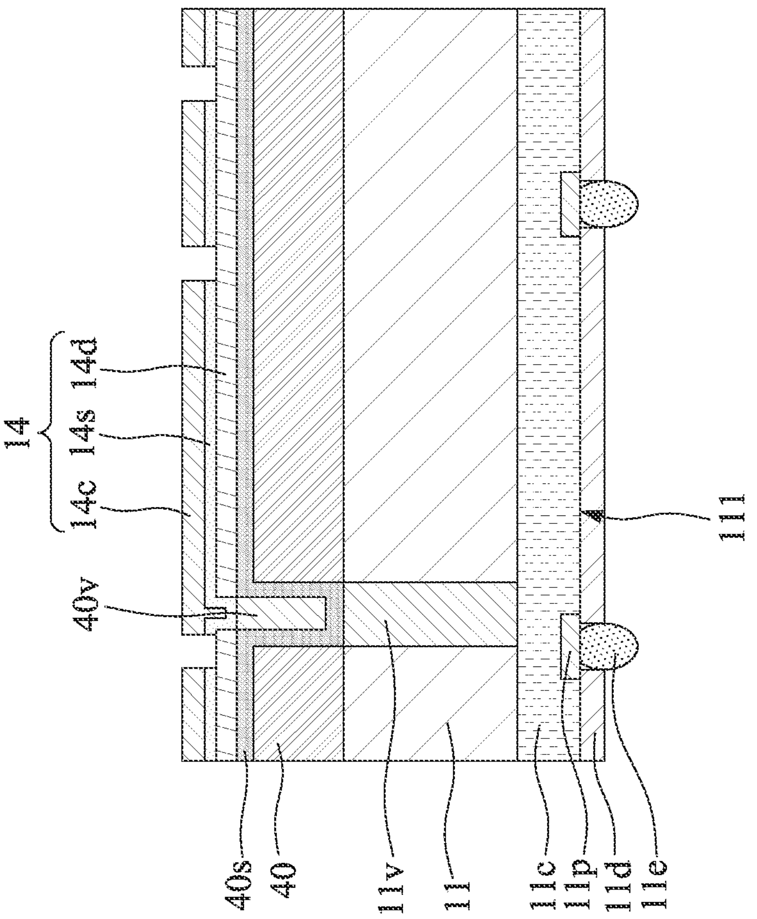

Referring to FIG. 6N, the electrical contact 11*e* may be formed over the circuit region 11*c* in proximity to, adjacent to, or disposed over the surface 111. A singulation may be performed to separate out individual electronic components (or unit chips). The singulation may be performed, for example, by using a dicing saw, laser or other appropriate cutting techniques. The electronic component 11 may be electrically connected with the carrier 10 (as shown in FIG. 4) through the electrical contact 11*e*. The carrier 10 may be electrically connected with the power regulating device 12 through the conductive element 12*w*. The obtained structure may be similar to the electronic device 4 in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a unit chip including:
an electronic component having a backside surface and a power delivery circuit exposed from the backside surface; and
a reinforcement supporting the electronic component;
a power regulating device within the reinforcement and attached to the backside surface of the electronic component through an adhesive layer; and
a conductive element within the reinforcement and connected with the backside surface of the electronic component through a first seed layer, wherein the conductive element is configured to transmit a power signal to the power delivery circuit;
wherein the reinforcement includes a thermosetting reinforcement or a glass reinforcement, and
wherein the power regulating device and the conductive element are overlapped in a direction substantially parallel to the backside surface of the electronic component.

2. The electronic device of claim 1, further comprising:
a dielectric layer disposed over the reinforcement and having a cavity to expose a top surface of the conductive element.

3. The electronic device of claim 2, further comprising:
a second seed layer contacting the dielectric layer and the top surface of the conductive element.

4. The electronic device of claim 3, wherein the reinforcement includes fillers disposed on at least two sides of the conductive element.

5. The electronic device of claim 4, wherein the conductive element tapers toward the power delivery circuit.

6. The electronic device of claim 2, wherein lateral surfaces of the dielectric layer, the reinforcement, and the electronic component are substantially coplanar.

7. The electronic device of claim 1, wherein the electronic component has a circuit region and a logic circuit disposed between the circuit region and the power delivery circuit.

8. The electronic device of claim 7, further comprising:
a carrier over which the unit chip is disposed and configured to provide a power path between a power source and the unit chip, wherein the electronic component is disposed between the carrier and the reinforcement.

9. The electronic device of claim 8, wherein the carrier is electrically connected with the power delivery circuit through a connection not covered by the unit chip.

10. The electronic device of claim 1, wherein the conductive element comprises one or more holes therein, and dimensions and shapes of the one or more holes are irregular, and wherein the conductive element comprises a cured silver (Ag) paste mixed with a resin and conductive particles.

11. The electronic device of claim 1, wherein the first seed layer contacts an entire sidewall of the conductive element.

12. The electronic device of claim 1, further comprising:
a carrier over which the unit chip is disposed and configured to provide a power path between a power source and the unit chip; and
an interconnection structure disposed over the reinforcement, wherein the power regulating device includes a first conductive pad electrically connected with the interconnection structure through a second seed layer and a second conductive pad electrically connected with the carrier through a connection not covered by the unit chip.

13. An electronic device, comprising:

a unit chip including:

an electronic component having a power delivery circuit and a logic circuit;

a first conductive element within the electronic component;

a reinforcement supporting the electronic component and defining a first cavity to expose a top surface of the first conductive element;

a first seed layer contacting the top surface of the first conductive element;

a second conductive element within the reinforcement, wherein the first seed layer contacts an entire sidewall of the second conductive element;

a dielectric layer disposed over the reinforcement and having a second cavity to expose a top surface of the second conductive element; and a second seed layer contacting the dielectric layer and the top surface of the second conductive element, wherein lateral surfaces of the dielectric layer, the reinforcement, and the electronic component are substantially coplanar.

14. The electronic device of claim 13, wherein the unit chip further comprises:

a power regulating device within the reinforcement, wherein the power regulating device and the second conductive element are overlapped in a direction substantially parallel to a backside surface of the electronic component.

15. The electronic device of claim 14, wherein the power regulating device is attached to the backside surface of the electronic component through an adhesive layer and includes a conductive pad at least partially exposed from the reinforcement.

16. The electronic device of claim 15, further comprising:

a carrier over which the unit chip is disposed and configured to provide a power path between a power source and the unit chip, wherein the power regulating device is electrically connected with a conductive layer through the second seed layer and electrically connected with the carrier through a connection not covered by the unit chip, and wherein the connection extends along the lateral surfaces of the dielectric layer, the reinforcement, and the electronic component.

17. The electronic device of claim 16, wherein the second conductive element comprises one or more holes therein, and dimensions and shapes of the one or more holes are irregular, and wherein the second conductive element comprises a cured silver (Ag) paste mixed with a resin and conductive particles.

18. The electronic device of claim 13, wherein the electronic component includes I/O connections, and the logic circuit is between the I/O connections and the power delivery circuit, and wherein the reinforcement is exclusive of a capacitance device.

19. The electronic device of claim 18, further comprising:

a carrier over which the unit chip is disposed, wherein the electronic component is electrically connected with the carrier through the I/O connections and the second conductive element is configured to transmit a power signal to the logic circuit.

20. The electronic device of claim 19, wherein the unit chip further comprises:

a conductive layer disposed over the dielectric layer and configured to electrically connect the second conductive element and the carrier.

* * * * *